United States Patent
Yang

(10) Patent No.: US 12,438,073 B2
(45) Date of Patent: Oct. 7, 2025

(54) WINDOW BALL GRID ARRAY (WBGA) PACKAGE

(71) Applicant: NANYA TECHNOLOGY CORPORATION, New Taipei (TW)

(72) Inventor: Wu-Der Yang, Taoyuan (TW)

(73) Assignee: NANYA TECHNOLOGY CORPORATION, New Taipei (TW)

( * ) Notice: Subject to any disclaimer, the term of this patent is extended or adjusted under 35 U.S.C. 154(b) by 822 days.

(21) Appl. No.: 17/739,427

(22) Filed: May 9, 2022

(65) Prior Publication Data

US 2023/0361012 A1 Nov. 9, 2023

(51) Int. Cl.
*H01L 23/498* (2006.01)
*H01L 21/48* (2006.01)
(Continued)

(52) U.S. Cl.
CPC .... *H01L 23/49816* (2013.01); *H01L 21/4857* (2013.01); *H01L 21/486* (2013.01); *H01L 21/565* (2013.01); *H01L 23/49822* (2013.01); *H01L 23/49838* (2013.01); *H01L 24/05* (2013.01); *H01L 24/06* (2013.01);
(Continued)

(58) Field of Classification Search
CPC ........... H01L 24/05; H01L 24/03; H01L 2224/02311; H01L 2224/02331; H01L 23/5226; H01L 2224/02372; H01L 2224/02375; H01L 2224/04042; H01L 2224/0612; H01L 24/06; H01L 2224/02371; H01L 2224/02373; H01L 2224/02381; H01L 2224/05569
See application file for complete search history.

(56) References Cited

U.S. PATENT DOCUMENTS

2010/0051341 A1 3/2010 Cheng et al.
2011/0084374 A1* 4/2011 Chen .................. H01L 24/06
257/690
(Continued)

FOREIGN PATENT DOCUMENTS

TW 200537630 A 11/2005
TW 201113998 A 4/2011
(Continued)

OTHER PUBLICATIONS

Office Action and and the search report mailed on Nov. 27, 2024 related to U.S. Appl. No. 17/739,415.
Office Action mailed on Mar. 25, 2023 related to Taiwanese Application No. 111125207.
(Continued)

Primary Examiner — Robert G Bachner
(74) Attorney, Agent, or Firm — Xuan Zhang

(57) ABSTRACT

A WBGA package and a method of manufacturing a WBGA package are provided. The WBGA package includes a carrier having a first surface and a second surface opposite to the first surface of the carrier. The carrier has a through hole filled with a first package body and extending between the first surface and the second surface of the carrier. The WBGA package also includes an electronic component disposed on the second surface of the carrier. The electronic component includes a first bonding pad and a second bonding pad. The WBGA package also includes a first bonding wire electrically connected between the first bonding pad and the second bonding pad.

20 Claims, 19 Drawing Sheets

(51) Int. Cl.
*H01L 21/56* (2006.01)
*H01L 23/00* (2006.01)

(52) U.S. Cl.
CPC .............. *H01L 24/48* (2013.01); *H01L 24/49* (2013.01); *H01L 24/32* (2013.01); *H01L 24/73* (2013.01); *H01L 2224/05541* (2013.01); *H01L 2224/05555* (2013.01); *H01L 2224/05557* (2013.01); *H01L 2224/05573* (2013.01); *H01L 2224/05578* (2013.01); *H01L 2224/06132* (2013.01); *H01L 2224/32225* (2013.01); *H01L 2224/48101* (2013.01); *H01L 2224/48229* (2013.01); *H01L 2224/4917* (2013.01); *H01L 2224/49175* (2013.01); *H01L 2224/49177* (2013.01); *H01L 2224/73215* (2013.01); *H01L 2924/15151* (2013.01); *H01L 2924/15311* (2013.01); *H01L 2924/182* (2013.01)

(56) References Cited

U.S. PATENT DOCUMENTS

2020/0211979 A1   7/2020   Hsieh et al.
2021/0098413 A1*  4/2021   Yang ..................... H01L 24/48

FOREIGN PATENT DOCUMENTS

TW     201440197 A     10/2014
TW     202125782 A     7/2021

OTHER PUBLICATIONS

Office Action mailed on Aug. 30, 2023 related to Taiwanese Application No. 111125208.
Office Action and and the search report mailed on Apr. 8, 2025 related to U.S. Appl. No. 17/739,415.

* cited by examiner

WINDOW BALL GRID ARRAY (WBGA) PACKAGE

TECHNICAL FIELD

The present disclosure relates to a window ball grid array (WBGA) package, and more particularly, to a WBGA package having a bonding wire.

DISCUSSION OF THE BACKGROUND

In a window ball grid array (WBGA) package, a carrier may define a window over a central area of an electronic component and have bonding fingers on a surface opposite to the electronic component. Bonding pads of the electronic component may be electrically connected with the bonding fingers through conductive elements including, for example, bonding wires. The bonding fingers may each be electrically coupled to a corresponding input/output (I/O) terminal pad (e.g., a ball pad) by circuitry of the carrier. The I/O terminal pads may each include or be electrically coupled to a ground reference node (GND) or an electrical power node (VDD).

As the WBGA package becomes smaller in size while having an increasing number of pads, the pitch or spacing between adjacent pads becomes progressively finer. Consequently, connecting the bonding pads of an electronic component to their corresponding I/O terminal pads on the carrier is increasingly difficult. The final performance of the WBGA package may be decreased due to such interconnection limitations.

This Discussion of the Background section is provided for background information only. The statements in this Discussion of the Background are not an admission that the subject matter disclosed herein constitutes prior art with respect to the present disclosure, and no part of this Discussion of the Background may be used as an admission that any part of this application constitutes prior art with respect to the present disclosure.

SUMMARY

One aspect of the present disclosure provides a WBGA package. The WBGA package includes a carrier having a first surface and a second surface opposite to the first surface of the carrier. The carrier has a through hole filled with a first package body and extending between the first surface and the second surface of the carrier. The WBGA package also includes an electronic component disposed on the second surface of the carrier. The electronic component includes a first bonding pad and a second bonding pad. The WBGA package also includes a first bonding wire electrically connected between the first bonding pad and the second bonding pad.

Another aspect of the present disclosure provides a WBGA package. The WBGA package includes a carrier having a first surface and a second surface opposite to the first surface of the carrier. The carrier has a through hole filled with a first package body and extending between the first surface and the second surface of the carrier. The WBGA package also includes an electronic component disposed on the second surface of the carrier. The electronic component includes a first bonding pad and a second bonding pad electrically connected with a node.

Another aspect of the present disclosure provides a method of manufacturing a WBGA package. The method includes providing a carrier having a first surface and a second surface opposite to the first surface of the carrier. The carrier has a through hole extending between the first surface and the second surface of the carrier. The method also includes disposing an electronic component on the second surface of the carrier. The electronic component includes a first bonding pad and a second bonding pad. The method also includes electrically connecting the first bonding pad and the second bonding pad through a first bonding wire.

According to some embodiments of the present disclosure, a bonding pad on an electronic component is utilized to electrically connect an adjacent bonding pad to a bonding finger on a carrier. In other words, the bonding pad can be viewed as a relay point or a springboard for connecting the adjacent bonding pad to the bonding finger. The bonding pads can be electrically connected through a bonding wire.

By electrically connecting the bonding pads through a bonding wire, the routing of the circuitry of the carrier can be more flexible, the interconnections per unit area can be increased, and the pitch or spacing between adjacent pads can be further reduced to miniaturize the package size.

The foregoing has outlined rather broadly the features and technical advantages of the present disclosure so that the detailed description of the disclosure that follows may be better understood. Additional features and advantages of the disclosure will be described hereinafter, and form the subject of the claims of the disclosure. It should be appreciated by those skilled in the art that the conception and specific embodiment disclosed may be readily utilized as a basis for modifying or designing other structures or processes for carrying out the same purposes of the present disclosure. It should also be realized by those skilled in the art that such equivalent constructions do not depart from the spirit and scope of the disclosure as set forth in the appended claims.

BRIEF DESCRIPTION OF THE DRAWINGS

A more complete understanding of the present disclosure may be derived by referring to the detailed description and claims when considered in connection with the Figures, where like reference numbers refer to similar elements throughout the Figures, and:

DETAILED DESCRIPTION

Figure 1A:
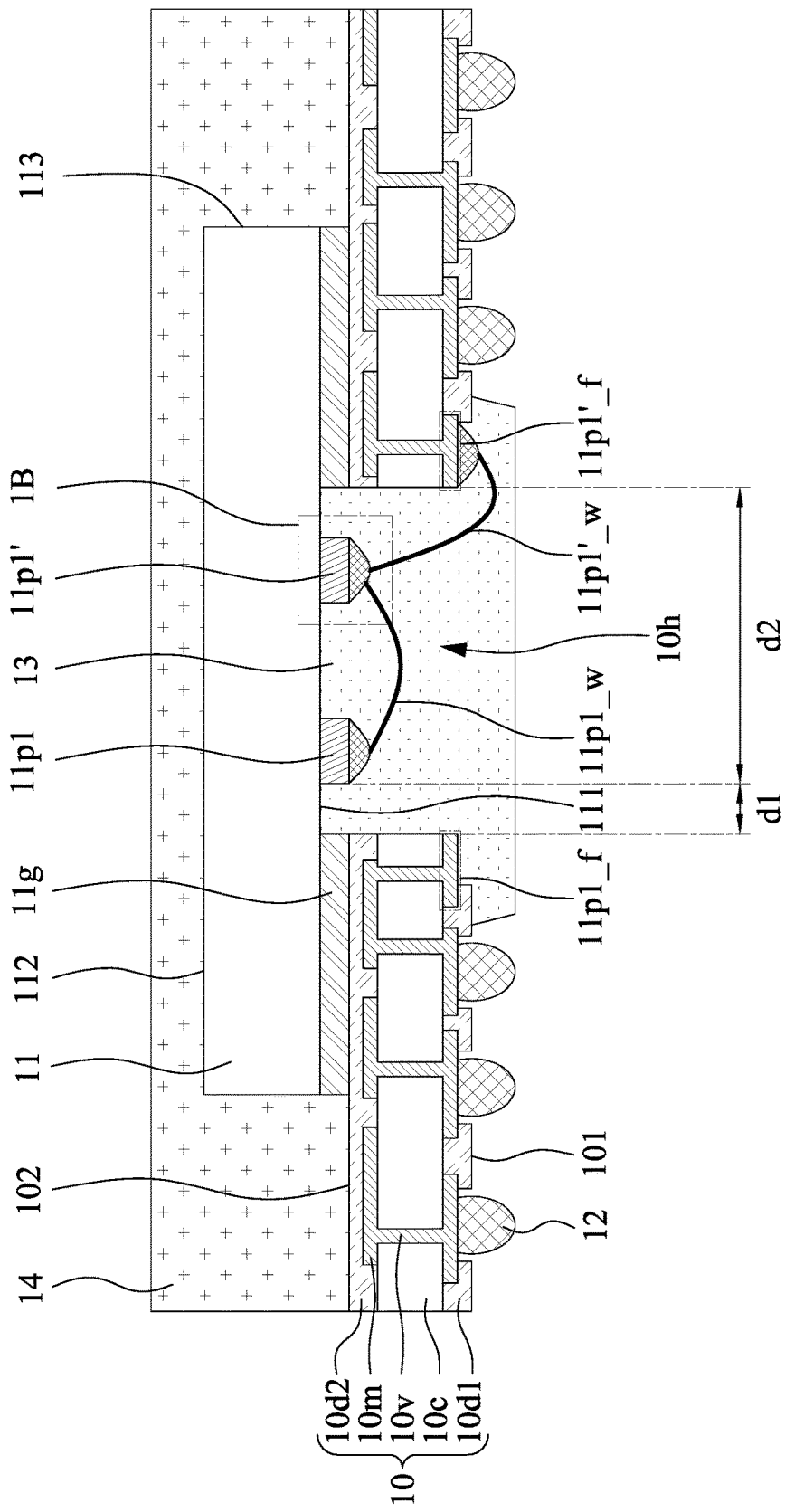
FIG. 1A is a schematic cross-sectional view of a WBGA package in accordance with some embodiments of the present disclosure.

Embodiments, or examples, of the disclosure illustrated in the drawings are now described using specific language. It shall be understood that no limitation of the scope of the disclosure is hereby intended. Any alteration or modification of the described embodiments, and any further applications of principles described in this document, are to be considered as normally occurring to one of ordinary skill in the art to which the disclosure relates. Reference numerals may be repeated throughout the embodiments, but this does not necessarily mean that feature(s) of one embodiment apply to another embodiment, even if they share the same reference numeral.

It shall be understood that, although the terms first, second, third, etc., may be used herein to describe various elements, components, regions, layers or sections, these elements, components, regions, layers or sections are not limited by these terms. Rather, these terms are merely used to distinguish one element, component, region, layer or section from another region, layer or section. Thus, a first element, component, region, layer or section discussed below could be termed a second element, component, region, layer or section without departing from the teachings of the present inventive concept.

The terminology used herein is for the purpose of describing particular example embodiments only, and is not intended to be limited to the present inventive concept. As used herein, the singular forms "a," "an" and "the" are intended to include the plural forms as well, unless the context clearly indicates otherwise. It shall be further understood that the terms "comprises" and "comprising," when used in this specification, point out the presence of stated features, integers, steps, operations, elements, or components, but do not preclude the presence or addition of one or more other features, integers, steps, operations, elements, components, or groups thereof.

FIG. 1A is a schematic cross-sectional view of a WBGA package 1 in accordance with some embodiments of the present disclosure. The WBGA package 1 may include a WBGA type chip package. As shown in FIG. 1, in some embodiments, the WBGA package 1 may include a carrier 10, an electronic component 11, an electrical contact 12 and package bodies 13, 14.

The carrier 10 may include a substrate. In some embodiments, the carrier 10 may include semiconductor material such as silicon, germanium, gallium, arsenic, and combinations thereof. In some embodiments, the carrier 10 may include plastic materials, ceramic materials or the like.

In some embodiments, the carrier 10 may include a core layer 10c and dielectric layers 10d1, 10d2 disposed on opposite sides of the core layer 10c. The carrier 10 may also include interconnections, circuitries or layout circuits, such as one or more vias 10v and one or more conductive lines (or conductive traces) 10m.

The conductive lines 10m may be disposed on the core layer 10c. The vias 10v may include through vias penetrating or traversing the core layer 10c to electrically connect the conductive lines 10m. A portion of the conductive lines 10m may be exposed from the dielectric layers 10d1 and 10d2, while another portion of the conductive lines 10m may be covered by the dielectric layers 10d1 and 10d2.

In some embodiments, the core layer 10c may include Prepreg (PP), Ajinomoto build-up film (ABF) or other suitable materials. In some embodiments, the vias 10v and the conductive lines 10m may each include conductive material, such as metal or other suitable materials. For example, the vias 10v and the conductive lines 10m may each include copper (Cu), silver (Ag), aluminum (Al), gold (Au), or an alloy thereof. In some embodiments, the dielectric layers 10d1 and 10d2 may each include dielectric materials, such as solder resist or other suitable materials.

The carrier 10 may have a surface 101 and a surface 102 opposite to the surface 101. In some embodiments, the carrier 10 may include or define a through hole 10h penetrating or traversing through the carrier 10. The through hole 10h may extend between the surface 101 and the surface 102. The through hole 10h may include a window opening, an opening, or a slot provided at the center of the carrier 10. In some embodiments, the through hole 10h may be adjacent or proximal to an edge of the carrier 10. In some embodiments, the through hole 10h may be provided at an edge of the carrier 10.

The exposed portion of the conductive lines 10m may include conductive pads for providing electrical connections between the carrier 10 and the electronic component 11 and electrical connections between the carrier 10 and an external electronic component (not shown).

For example, bonding fingers 11p1_f and 11p1'_f may be defined on the surface 101 of the carrier 10. The bonding fingers 11p1_f and 11p1'_f may each be adjacent to the through hole 10h.

From a cross-sectional view, the bonding fingers 11p1_f and 11p1'_f may be separated by the through hole 10h. For example, the bonding finger 11p1_f may be disposed on the left side of the through hole 10h and the bonding finger 11p1'_f may be disposed on the right side of the through hole 10h.

The bonding finger 11p1'_f may be electrically connected with a bonding pad 11p1' of the electronic component 11 by a bonding wire 11p1'_w. The bonding finger 11p1'_f may also be electrically connected with an input/output (I/O) terminal pad (such as a ball pad) on the surface 101 of the carrier 10 by the interconnections of the carrier 10.

For example, I/O terminal pads (such as ball pads) may be defined on the surface 101 of the carrier 10. The I/O terminal pads may be on a periphery of the carrier 10. The I/O terminal pads may be farther from the through hole 10h in comparison with the bonding fingers of the carrier 10. For example, the bonding finger 11p1_f may be disposed between an I/O terminal pad (where the electrical contact 12 is disposed) and the through hole 10h.

In some embodiments, the bonding finger 11p1_f and the bonding finger 11p1'_f may be electrically disconnected from each other. For example, the bonding finger 11p1_f and the bonding finger 11p1'_f may not be electrically connected. For example, the bonding finger 11p1'_f may be electrically connected with one of the I/O terminal pads and the bonding finger 11p1_f may be electrically disconnected from the one of the I/O terminal pads. For example, the bonding finger 11p1'_f may be electrically connected to a ground reference node (GND) and the bonding finger 11p1_f may be electrically disconnected from the GND. For example, the bonding finger 11p1'_f may be electrically connected to an electrical power node (VDD) and the bonding finger 11p1_f may be electrically disconnected from the VDD. For example, the bonding finger 11p1'_f may be electrically connected to a voltage node and the bonding finger 11p1_f may be electrically disconnected from the voltage node.

The electrical contact 12 may be disposed on the I/O terminal pad. For example, the electrical contact 12 may be electrically connected to an underlying printed circuit board (PCB) (not shown) to provide electrical connections, for example, I/O connections, of the carrier 10. For example, the electrical contact 12 may include or be electrically connected to a GND node, a VDD node or a voltage node. In some embodiments, the electrical contact 12 may include a controlled collapse chip connection (C4) bump, a ball grid array (BGA) or a land grid array (LGA).

The electronic component 11 may be disposed on the surface 102 of the carrier 10. The electronic component 11 may cover an end of the through hole 10h. A central portion of the electronic component 11 may face or be exposed from the through hole 10h.

In some embodiments, the electronic component 11 may have a surface 111 facing the carrier 10, a surface 112 facing away from the carrier 10 and a surface 113 (or a lateral surface) extending between the surface 111 and the surface 112. The surface 111 may include an active surface and the surface 112 may include a backside surface. Bonding pads 11p1 and 11p1' may be disposed on the surface 111 of the electronic component 11.

The electronic component 11 may be attached to the surface 102 of the carrier 10 through an adhesive layer 11g. The adhesive layer 11g may be in adjacent to the through hole 10h. The adhesive layer 11g may surround the through hole 10h. In some embodiments, a surface of the adhesive layer 11g may be substantially coplanar with an internal sidewall of the through hole 10h. In some embodiments, a surface of the adhesive layer 11g may be substantially coplanar with the surface 113 of the electronic component 11. In some embodiments, the surface 102 of the carrier 10 may be partially exposed from the adhesive layer 11g. The adhesive layer 11g may include an adhesive material, such as epoxy, a die attach film (DAF), glue or the like.

In some embodiments, the electronic component 11 may include a semiconductor die or a chip, such as a memory die (e.g., dynamic random access memory (DRAM) die, static random access memory (SRAM) die, etc.), a signal processing die (e.g., digital signal processing (DSP) die), a logic die (e.g., application processor (AP), system-on-a-chip (SoC), central processing unit (CPU), graphics processing unit (GPU), microcontroller, etc.), a power management die (e.g., power management integrated circuit (PMIC) die), a radio frequency (RF) die, a sensor die, a micro-electro-mechanical-system (MEMS) die, a front-end die (e.g., analog front-end (AFE) dies) or other active components.

In some embodiments, the bonding pads 11p1 and 11p1' may be symmetrically arranged on the surface 111 of the electronic component 11. For example, the bonding pads 11p1 and 11p1' may be symmetrical with respect to an imaginary line passing through a center point of the electronic component 11. For example, the bonding pad 11p1 may be disposed on the left side of the imaginary line and the bonding pad 11p1' may be disposed on the right side of the imaginary line.

In some embodiments, the bonding pads 11p1 and 11p1' may be configured to electrically connect to a same node. For example, the bonding pads 11p1 and 11p1' may be configured to electrically connect to a same GND or a same VDD.

In some embodiments, the bonding pad 11p1 may be closer to the bonding finger 11p1_f than the bonding pad 11p1'. In some embodiments, the bonding pad 11p1 may be proximal to the bonding finger 11p1_f and distal from the bonding finger 11p1'_f. For example, a distance "d1" between the bonding finger 11p1_f and a surface of the bonding pad 11p1 may be less than a distance "d2" between the bonding finger 11p1'_f and the surface of the bonding pad 11p1.

In some embodiments, the bonding pad 11p1' may be closer to the bonding finger 11p1'_f than the bonding pad 11p1. In some embodiments, the bonding pad 11p1' may be proximal to the bonding finger 11p1'_f and distal from the bonding finger 11p1_f. For example, a distance between the bonding finger 11p1'_f and a surface of the bonding pad 11p1' may be less than a distance between the bonding finger 11p1_f and the surface of the bonding pad 11p1'.

In some embodiments, a top surface of the bonding pads 11p1 and 11p1' may be recessed from the surface 102 of the carrier 10. For example, the bonding pads 11p1 and 11p1' may not be present in the through hole 10h. However, in some other embodiments, a top surface of the bonding pads 11p1 and 11p1' may be substantially coplanar with the surface 102 of the carrier 10. In some other embodiments, a top surface of the bonding pads 11p1 and 11p1' may be present in the through hole 10h.

In some embodiments, the bonding pads 11p1 and 11p1' may be electrically connected to each other through a bonding wire 11p1_w. The bonding pad 11p1' may be electrically connected to the bonding finger 11p1'_f through the bonding wire 11p1'_w. Therefore, the bonding pad 11p1 may be electrically connected to the bonding finger 11p1'_f by utilizing the bonding pad 11p1' as a relay point or a springboard. In other words, the bonding pad 11p1' is electrically connected between the bonding pad 11p1 and the bonding finger 11p1'_f. In other words, the bonding pad 11p1' is present in an electrical path between the bonding pad 11p1 and the bonding finger 11p1'_f.

In some embodiments, the bonding finger 11p1_f is closer to the bonding pad 11p1 than the bonding finger 11p1'_f. For example, the bonding finger 11p1_f is closer to the bonding pad 11p1 than any other bonding fingers on the carrier 10. Instead of electrically connecting with a closer bonding finger (i.e., the bonding finger 11p1_f), the bonding pad 11p1 is electrically connected with the bonding finger 11p1'_f through the bonding pad 11p1'.

In some embodiments, the bonding wire 11p1_w may be partially present in the through hole 10h. In some embodiments, the bonding wire 11p1'_w may extend through the through hole 10h. In some embodiments, the bonding wire 11p1_w and the bonding wire 11p1'_w may have different lengths. In some embodiments, the bonding wire 11p1_w and the bonding wire 11p1'_w may have different curvatures from a cross-sectional view. In some embodiments, the bonding wire 11p1_w and the bonding wire 11p1'_w may extend from the bonding pads 11p1' in different directions, such as in opposite directions.

The package body 13 may be disposed in the through hole 10h. The package body 13 may fill up the through hole 10h. The package body 13 may be disposed on, cover or contact a part of the surface 101 of the carrier 10.

The package body 13 may be disposed on, cover or contact a part of the surface 111 of the electronic component 11. The package body 13 may be disposed on, cover or contact at least a part of adhesive layer 11g. The package body 13 may be disposed on, cover, contact or surround at least a part of the bonding pads 11p1 and 11p1'. The package body 13 may be disposed on, cover, contact or surround at least a part of the bonding wires 11p1_w and 11p1'_w. In some embodiments, the bonding wires 11p1_w and 11p1'_w may be encapsulated by the package body 13.

In some embodiments, the package body 13 may include molding material, such as a Novolac-based resin, an epoxy-based resin, a silicone-based resin, or another suitable encapsulant. Suitable fillers may also be included, such as powdered $SiO_2$.

The package body 14 may be disposed on the surface 102 of the carrier 10 to encapsulate or cover the electronic component 11. The package body 14 may be disposed on, cover or contact the surface 112 of the electronic component 11. The package body 14 may be disposed on, cover or contact the lateral surface 113 of the electronic component 11. The package body 14 may be disposed on, cover or contact at least a part of adhesive layer 11g.

In some embodiments, the package body 14 may include molding material, such as a Novolac-based resin, an epoxy-based resin, a silicone-based resin, or another suitable encapsulant. Suitable fillers may also be included, such as powdered $SiO_2$. In some embodiments, the package body 13 and the package body 14 may include the same material. In some embodiments, the package body 13 and the package body 14 may include different materials.

Figure 1B:
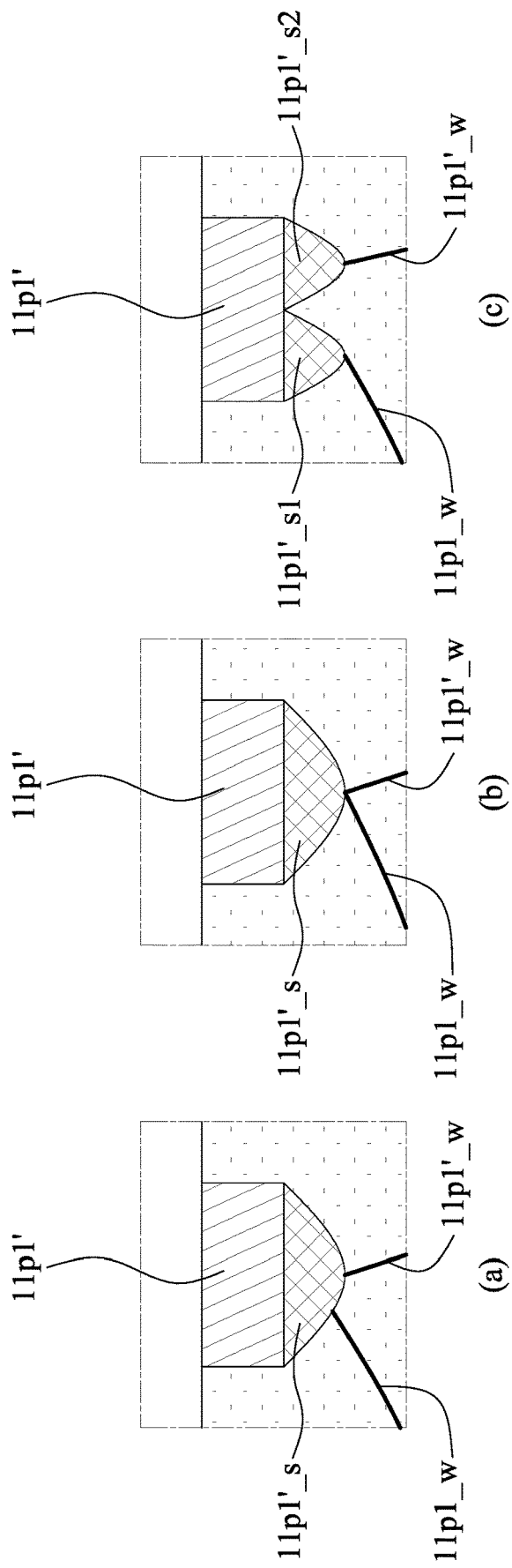
FIG. 1B illustrates enlarged views of a part of a WBGA package in accordance with some embodiments of the present disclosure.

FIG. 1B illustrates enlarged views (a), (b) and (c) of a part of a WBGA package in accordance with some embodiments of the present disclosure. In some embodiments, the enlarged views (a), (b) and (c) may each illustrate a part in the dotted box 1B of the WBGA package 1 in FIG. 1A.

Referring to the enlarged view (a) in FIG. 1B, a bonding stud 11p1'_s may be disposed on the bonding pads 11p1'. In some embodiments, the bonding wire 11p1_w and the bonding wire 11p1'_w may be connected with the bonding stud 11p1'_s at different locations or different sites. For example, an end of the bonding wire 11p1_w on the bonding stud 11p1'_s may be spaced apart from an end of the bonding wire 11p1'_w on the bonding stud 11p1'_s. For example, the bonding wire 11p1_w and the bonding wire 11p1'_w may extend from different locations or different sites on the bonding stud 11p1'_s.

Referring to the enlarged view (b) in FIG. 1B, in some embodiments, the bonding wire 11p1_w and the bonding wire 11p1'_w may be connected with the bonding stud 11p1'_s at a same location or a same site. For example, an end of the bonding wire 11p1_w on the bonding stud 11p1'_s may be connected with an end of the bonding wire 11p1'_w on the bonding stud 11p1'_s. For example, the bonding wire 11p1_w and the bonding wire 11p1'_w may extend from a same location or a same site on the bonding stud 11p1'_s.

Referring to the enlarged view (c) in FIG. 1B, bonding studs 11p1'_s1 and 11p1'_s2 may be disposed on the bonding pads 11p1'. The bonding stud 11p1'_s1 may be next to the bonding stud 11p1'_s2. The bonding stud 11p1'_s1 may be spaced apart from the bonding stud 11p1'_s2. In some embodiments, a projection area of the bonding stud 11p1'_s1 on the bonding pads 11p1' may be spaced apart from a projection area of the bonding stud 11p1'_s1 on the bonding pads 11p1'. For example, a projection area of the bonding stud 11p1'_s1 on the bonding pads 11p1' and a projection area of the bonding stud 11p1'_s1 on the bonding pads 11p1' may be non-overlapping.

In some embodiments, a surface area of the bonding pad 11p1' (or other bonding pads being utilized as a relay point or a springboard) may be greater than other bonding pads on the electronic component 11. For example, a surface area of the bonding pad 11p1' may be greater than a surface area of the bonding pad 11p1 shown in FIG. 1A.

In some embodiments, an area of the bonding pad 11p1' (or other bonding pads being utilized as a relay point or a springboard) may have an adequate surface area for accommodating and bonding two bonding wires at the same time.

In some embodiments, the bonding wire 11p1_w may be connected with the bonding stud 11p1'_s1 and the bonding wire 11p1'_w may be connected with the bonding stud 11p1'_s2. For example, the bonding wire 11p1_w may extend from the bonding stud 11p1'_s1 and the bonding wire 11p1'_w may extend from the bonding stud 11p1'_s2.

Figure 2A:
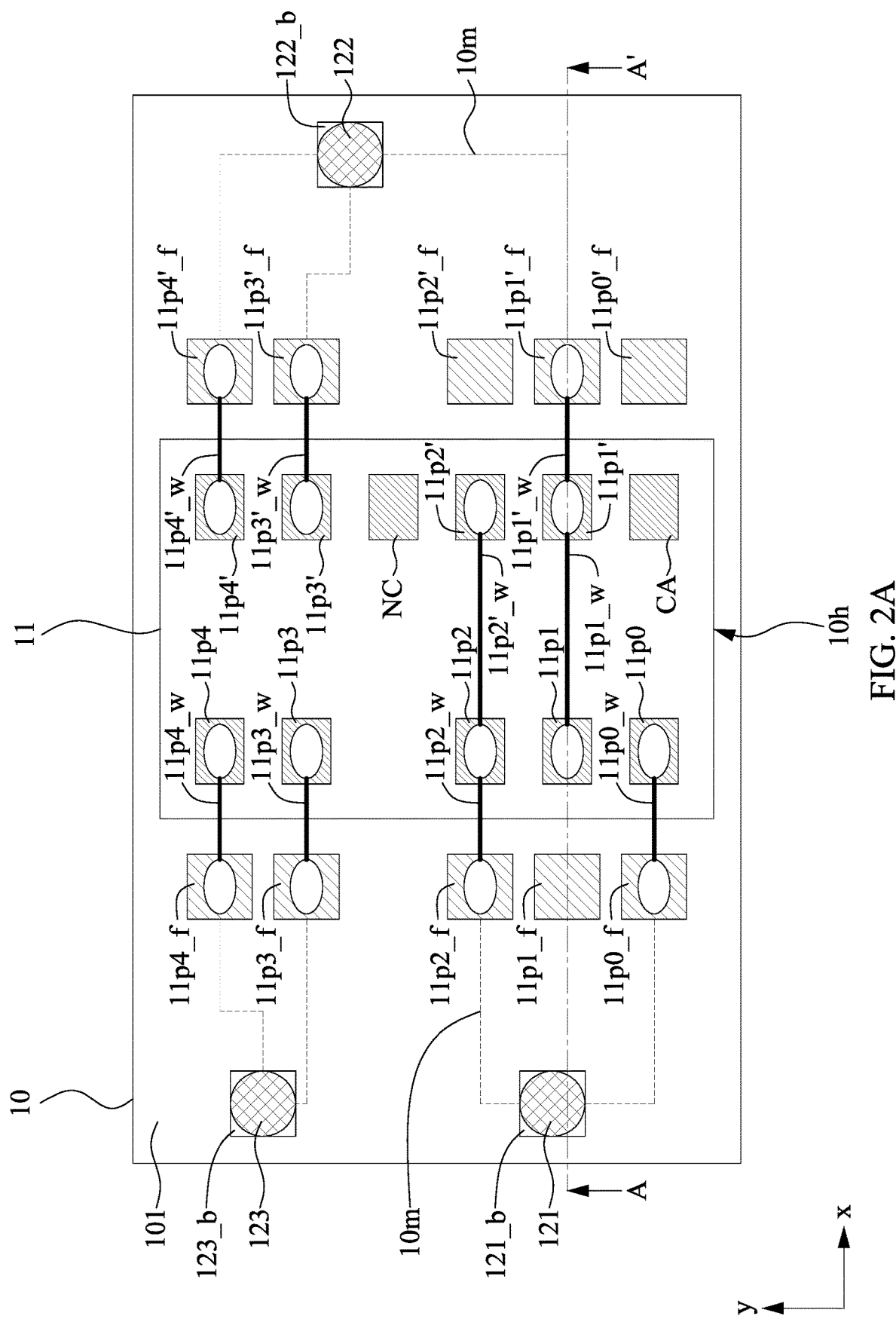
FIG. 2A is a top view of a WBGA package in accordance with some embodiments of the present disclosure.

FIG. 2A is a top view of a WBGA package in accordance with some embodiments of the present disclosure. In some embodiments, the WBGA package 1 in FIG. 1A may be a cross-sectional view along the line A-A' of the WBGA package shown in FIG. 2A.

As shown, the surface 111 of the electronic component 11 may be at least partially exposed from the through hole 10h. In some embodiments, the carrier 10 may entirely surround the through hole 10h. In some embodiments, the through hole 10h may have a quadrilateral, rectangular, square, polygonal, oval, or circular shape, or any other suitable shape.

A plurality of bonding pads 11p0, 11p1, 11p2, 11p3 and 11p4 may be disposed on the surface 111 of the electronic component 11 and exposed from the through hole 10h.

The bonding pads 11p0, 11p1, 11p2, 11p3 and 11p4 may be arranged in a row or arranged in a straight line. The bonding pads 11p0, 11p1, 11p2, 11p3 and 11p4 may be arranged along the reference y-axis. The bonding pads 11p0, 11p1, 11p2, 11p3 and 11p4 may be arranged along an edge of the carrier 10.

Similarly, a plurality of bonding pads CA, 11p1', 11p2', NC, 11p3' and 11p4' may be disposed on the surface 111 of the electronic component 11 and exposed from the through hole 10h.

The bonding pads CA, 11p1', 11p2', NC, 11p3' and 11p4' may be arranged in a row or arranged in a straight line. The bonding pads CA, 11p1', 11p2', NC, 11p3' and 11p4' may be arranged along the reference y-axis. The bonding pads CA, 11p1', 11p2', NC, 11p3' and 11p4' may be arranged along an edge of the carrier 10.

Some of the bonding pads in the two rows stated above may be aligned along the reference x-axis. For example, the bonding pads 11p1 and 11p1' may be aligned along the reference x-axis. The bonding pads 11p2 and 11p2' may be aligned along the reference x-axis. The bonding pads 11p3 and 11p3' may be aligned along the reference x-axis. The bonding pads 11p4 and 11p4' may be aligned along the reference x-axis.

In some embodiments, the aligned pair of two bonding pads may be configured to electrically connect to a same node. For example, the bonding pads 11p1 and 11p1' may both be configured to electrically connect to a same GND, a same VDD or a same voltage node. For example, the bonding pads 11p2 and 11p2' may both be configured to electrically connect to a same GND, a same VDD or a same voltage node.

In some embodiments, the ground terminals of the electronic component 11 may be symmetrically arranged on the surface 111. In some embodiments, the power terminals of the electronic component 11 may be symmetrically arranged on the surface 111.

In some embodiments, the bonding pads 11p1, 11p1', 11p3, 11p3', 11p4, 11p4' may be ground terminals of the electronic component 11 and may be configured to electrically connect to a ground. In some embodiments, the bonding pads 11p2 and 11p2' may be power terminals of the electronic component 11 and may be configured to electrically connect to an electrical power.

The arrangements of the ground terminals and the power terminals of the electronic component 11 may be different from the above arrangements and are not limited thereto. The arrangements of the ground terminals and the power terminals of the electronic component 11 may be adjusted according to design requirements, such as the layout specification of the electronic component 11.

In some embodiments, the bonding pad NC may include a dummy pad or an electrically floating pad. For example, there may be no electrical connection for establishing a specific voltage on the bonding pad NC. In some embodiments, the bonding pad CA may include a pad for connecting to a common address node.

A plurality of bonding fingers 11p0_f, 11p_f, 11p2_f, 11p3_f and 11p4_f may be disposed on the surface 101 of the carrier 10.

The bonding fingers 11p0_f, 11p1_f, 11p2_f, 11p3_f and 11p4_f may be arranged in a row or arranged in a straight line. The bonding fingers 11p0_f, 11p1_f, 11p2_f, 11p3_f and 11p4_f may be arranged along the reference y-axis. The bonding fingers 11p0_f, 11p1_f, 11p2_f, 11p3_f and 11p4_f may be arranged along an edge of the carrier 10.

The bonding fingers 11p0_f, 11p1_f, 11p2_f, 11p3_f and 11p4_f may be aligned with the bonding pads 11p0, 11p1, 11p2, 11p3 and 11p4 along the reference x-axis. For example, the bonding finger 11p0_f may be aligned with the bonding pad 11p0. For example, the bonding finger 11p1_f may be aligned with the bonding pad 11p1.

In some embodiments, the aligned pair of the bonding finger and the bonding pad may be the closest pair. For example, the bonding finger 11p0_f may be closer to the bonding pad 11p0 than any other bonding finger on the surface 101 of the carrier 10. For example, the bonding finger 11p1_f may be closer to the bonding pad 11p1 than any other bonding finger on the surface 101 of the carrier 10.

Similarly, a plurality of bonding fingers 11p1'_f, 11p2'_f, 11p3'_f and 11p4'_f may be disposed on the surface 101 of the carrier 10.

The bonding fingers 11p1'_f, 11p2'_f, 11p3'_f and 11p4'_f may be arranged in a row or arranged in a straight line. The bonding fingers 11p1'_f, 11p2'_f, 11p3'_f and 11p4'_f may be arranged along the reference y-axis. The bonding fingers 11p1'_f, 11p2'_f, 11p3'_f and 11p4'_f may be arranged along an edge of the carrier 10.

The bonding fingers 11p1'_f, 11p2'_f, 11p3'_f and 11p4'_f may be aligned with the bonding pads 11p1', 11p2', 11p3' and 11p4' along the reference x-axis. For example, the bonding finger 11p1'_f may be aligned with the bonding pad 11p1'. For example, the bonding finger 11p2'_f may be aligned with the bonding pad 11p2'.

In some embodiments, the aligned pair of the bonding finger and the bonding pad may be the closest pair. For example, the bonding finger 11p1'_f may be closer to the bonding pad 11p1' than any other bonding finger on the surface 101 of the carrier 10. For example, the bonding finger 11p2'_f may be closer to the bonding pad 11p2' than any other bonding finger on the surface 101 of the carrier 10.

One or more of the bonding fingers 11p0_f, 11p1_f, 11p2_f, 11p3_f, 11p4_f, 11p1'_f, 11p2'_f, 11p3'_f and 11p4'_f may be electrically connected to an I/O terminal pad (such as a ball pad) by the conductive line 10m.

For example, the bonding fingers 11p0_f and 11p2_f may be electrically connected to an I/O terminal pad 121_b. An electrical contact 121 may be disposed on the I/O terminal pad 121_b.

For example, the bonding fingers 11p1'_f, 11p3'_f and 11p4'_f may be electrically connected to an I/O terminal pad 122_b. An electrical contact 122 may be disposed on the I/O terminal pad 122_b.

For example, the bonding fingers 11p3_f and 11p4_f may be electrically connected to an I/O terminal pad 123_b. An electrical contact 123 may be disposed on the I/O terminal pad 123_b.

In some embodiments, the electrical contact 121, the electrical contact 122 and the electrical contact 123 may each include or be electrically connected to a GND, a VDD or a voltage node. As an example, the electrical contact 121 may include or be electrically connected to a VDD. The electrical contact 122 and the electrical contact 123 may both include or be electrically connected to a GND.

One or more of the bonding pads 11p0, 11p1, 11p2, 11p3, 11p4, CA, 11p1', 11p2', 11p3' and 11p4' may be electrically connected to a corresponding bonding finger, which may be electrically connected to a GND, a VDD or a voltage node through the conductive lines 10m of the carrier 10.

In some embodiments, in order to reduce the bonding lengths of the bonding wires, the bonding pads 11p0, 11p1, 11p2, 11p3, 11p4, CA, 11p1', 11p2', 11p3' and 11p4' may be electrically connected to a closer bonding finger. For example, the bonding pads 11p0 and 11p2 may be power terminals, and may be electrically connected to a VDD through the bonding fingers 11p0_f and 11p2_f (which may be electrically connected to a VDD through the conductive lines 10m of the carrier 10, the I/O terminal pad 121_b and the electrical contact 121).

For example, the bonding pads 11p1' and 11p3' may be grounding terminals, and may be electrically connected to a GND through the bonding fingers 11p1'_f and 11p3'_f (which may be electrically connected to a GND through the conductive lines 10m of the carrier 10, the I/O terminal pad 122_b and the electrical contact 122).

As the WBGA package becomes smaller in size while having an increasing number of pads, the pitch or spacing between adjacent pads becomes progressively finer. Consequently, connecting the bonding pads of an electronic component to their corresponding I/O terminal pads on the carrier is increasingly difficult.

For example, the bonding pad 11p1 may be a grounding terminal and the bonding finger 11p1_f (which is the closest bonding finger for the bonding pad 11p1) may be at least partially surrounded by the conductive lines 10m between the electrical contact 121 (which may be electrically connected to a VDD) and the bonding fingers 11p0_f and between the electrical contact 121 and the bonding fingers 11p2_f.

The bonding pad 11p1 may not be able to connect to a GND through the bonding finger 11p1_f because the layout space or wiring space of the bonding finger 11p1_f is limited, and thus the bonding finger 11p1_f cannot be connected with a GND.

Therefore, instead of electrically connecting with a closer bonding finger (i.e., the bonding finger 11p_f), the bonding pad 11p1 is electrically connected with the bonding finger 11p1'_f through the bonding pad 11p1' and the bonding wire 11p1_w.

Similarly, the bonding pad 11p2' may be a power terminal and the bonding finger 11p2'_f (which is the closest bonding finger for the bonding pad 11p2') may be at least partially surrounded by the conductive lines 10m between the electrical contact 122 (which may be electrically connected to a GND) and the bonding fingers 11p1'_f and between the electrical contact 122 and the bonding fingers 11p3'_f.

The bonding pad 11p2' may not be able to connect to a VDD through the bonding finger 11p2'_f because the layout space or wiring space of the bonding finger 11p2'_f is limited, and thus the bonding finger 11p2'_f cannot be connected with a VDD.

Therefore, instead of electrically connecting with a closer bonding finger (i.e., the bonding finger 11p2'_f), the bonding pad 11p2' is electrically connected with the bonding finger 11p2_f through the bonding pad 11p2 and the bonding wire 11p2'_w.

According to some embodiments of the present disclosure, a bonding pad (such as the bonding pad 11p1') on an electronic component (such as the electronic component 11) is utilized to electrically connect an adjacent bonding pad (such as the bonding pad 11p1) to a bonding finger (such as the bonding finger 11p1'_f) on a carrier (such as the carrier 10). In other words, the bonding pad 11p1' can be viewed as a relay point or a springboard for connecting the adjacent bonding pad 11p1 to the bonding finger 11p1' _f. The bonding pads 11p1 and 11p1' can be electrically connected through a bonding wire (such as the bonding wire 11p1_w).

By electrically connecting the bonding pads 11p1 and 11p1' through the bonding wire 11p1_w, the routing of the circuitry of the carrier 10 can be more flexible, the interconnections per unit area can be increased, and the pitch or spacing between adjacent pads can be further reduced to miniaturize the package size.

Figure 2B:
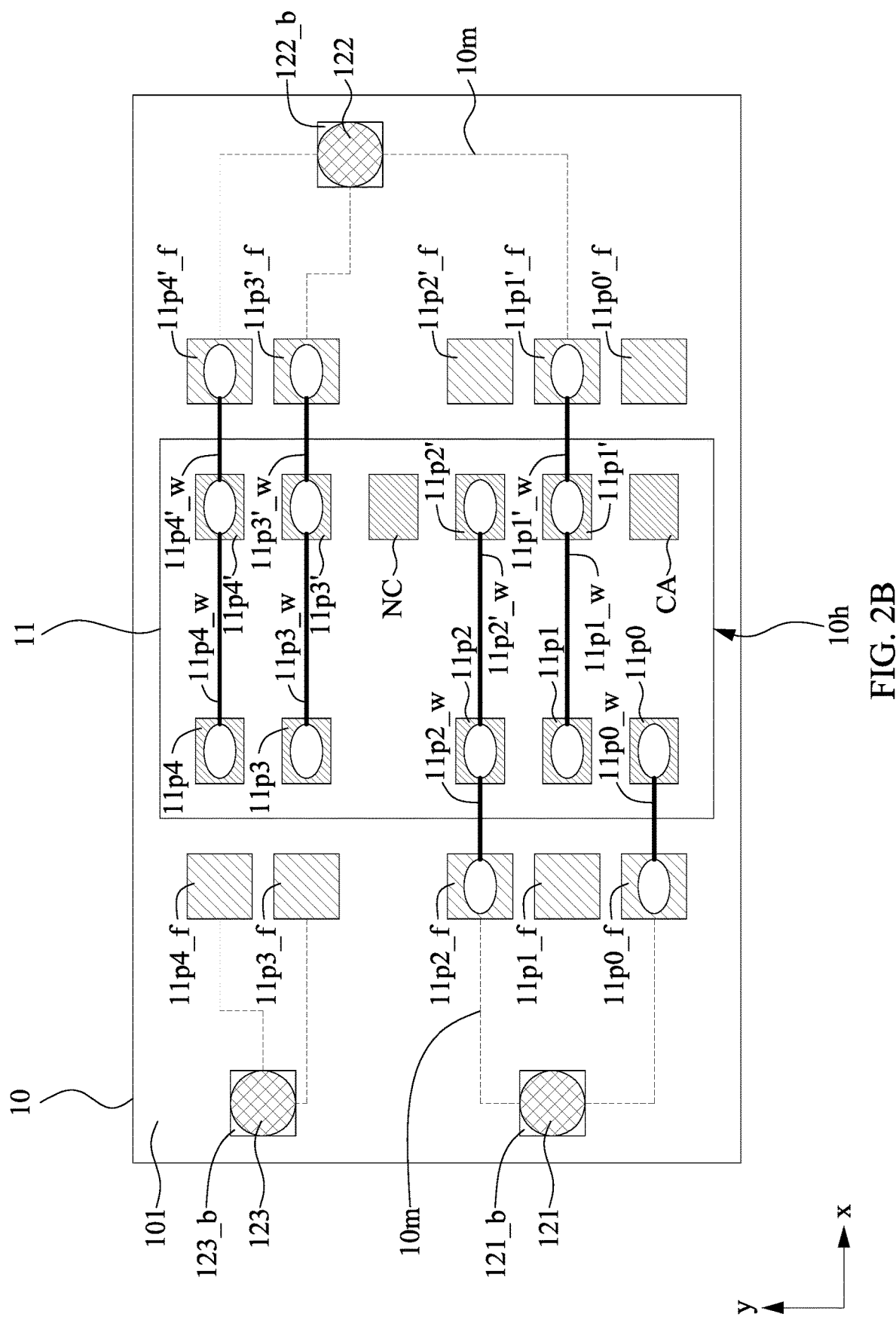
FIG. 2B is a top view of a WBGA package in accordance with some embodiments of the present disclosure.

FIG. 2B is a top view of a WBGA package in accordance with some embodiments of the present disclosure. The WBGA package in FIG. 2B is similar to that of the WBGA package in FIG. 2A, except that the bonding pad 11p3 is electrically connected with the bonding finger 11p3'_f through the bonding wire 11p3_w and the bonding pad 11p3'.

For example, the bonding pad 11p3 may be a grounding terminal and may be designed to connect to either the electrical contact 123 (through the bonding finger 11p3_f) or the electrical contact 122 (through the bonding finger 11p3'_f).

In addition, the bonding pad 11p4 is electrically connected with the bonding finger 11p4'_f through the bonding wire 11p4_w and the bonding pad 11p4'.

For example, the bonding pad 11p4 may be a grounding terminal and may be designed to connect to either the electrical contact 123 (through the bonding finger 11p4_f) or the electrical contact 122 (through the bonding finger 11p4'_f).

Figure 2C:
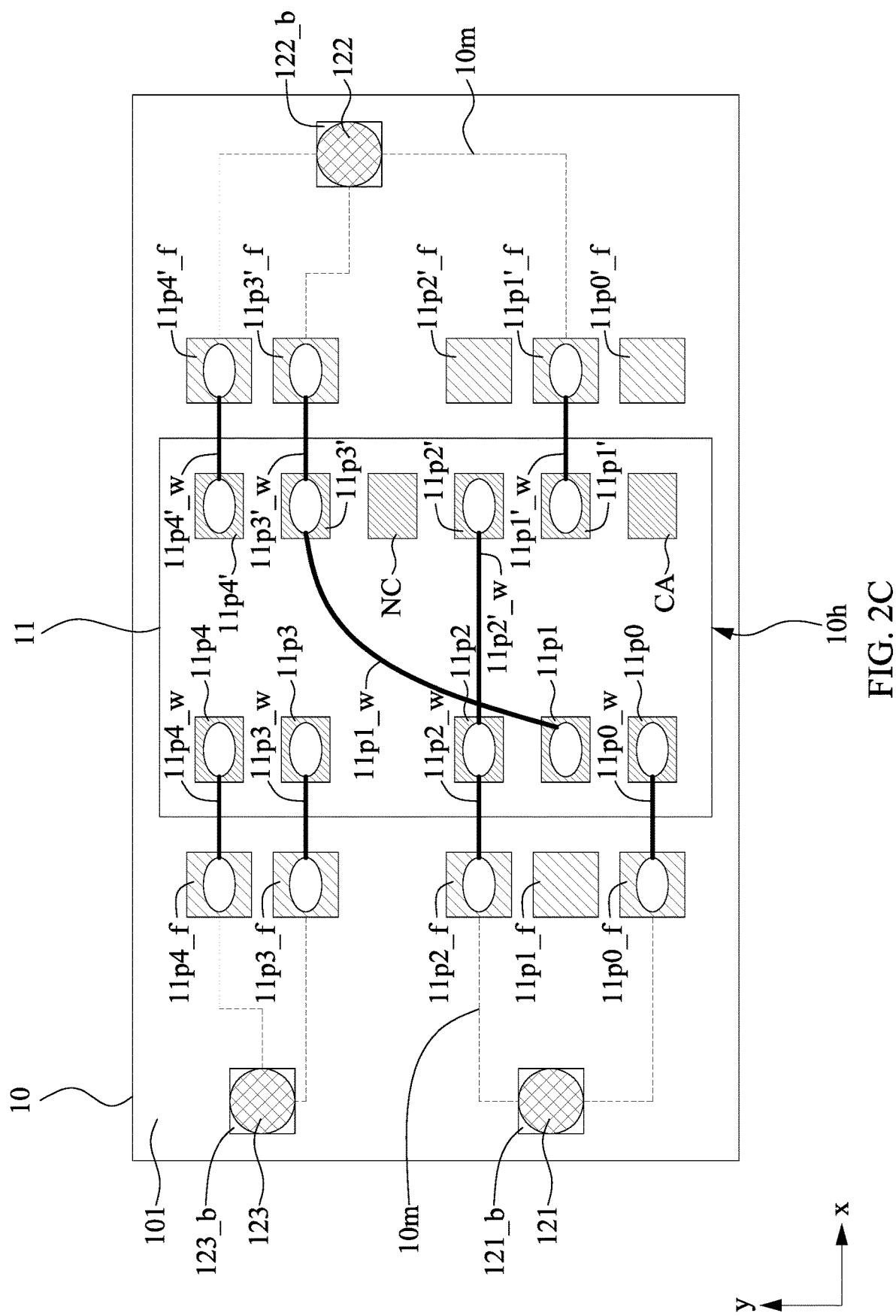
FIG. 2C is a top view of a WBGA package in accordance with some embodiments of the present disclosure.

FIG. 2C is atop view of a WBGA package in accordance with some embodiments of the present disclosure. The WBGA package in FIG. 2C is similar to that of the WBGA package in FIG. 2A, except that the bonding pad 11p1 is electrically connected with the bonding finger 11p3'_f through the bonding wire 11p1_w, the bonding pad 11p3' and the bonding wire 11p3'_w.

In some embodiments, the bonding wire 11p1_w and the bonding wire 11p2'_w may intersect or cross each other. In such embodiments, the bonding wire 11p1_w and the bonding wire 11p2'_w may include insulated bonding wires. For example, insulated coatings may be provided on the bonding wire 11p1_w and the bonding wire 11p2'_w to allow wires to touch or contact each other.

Figure 2D:
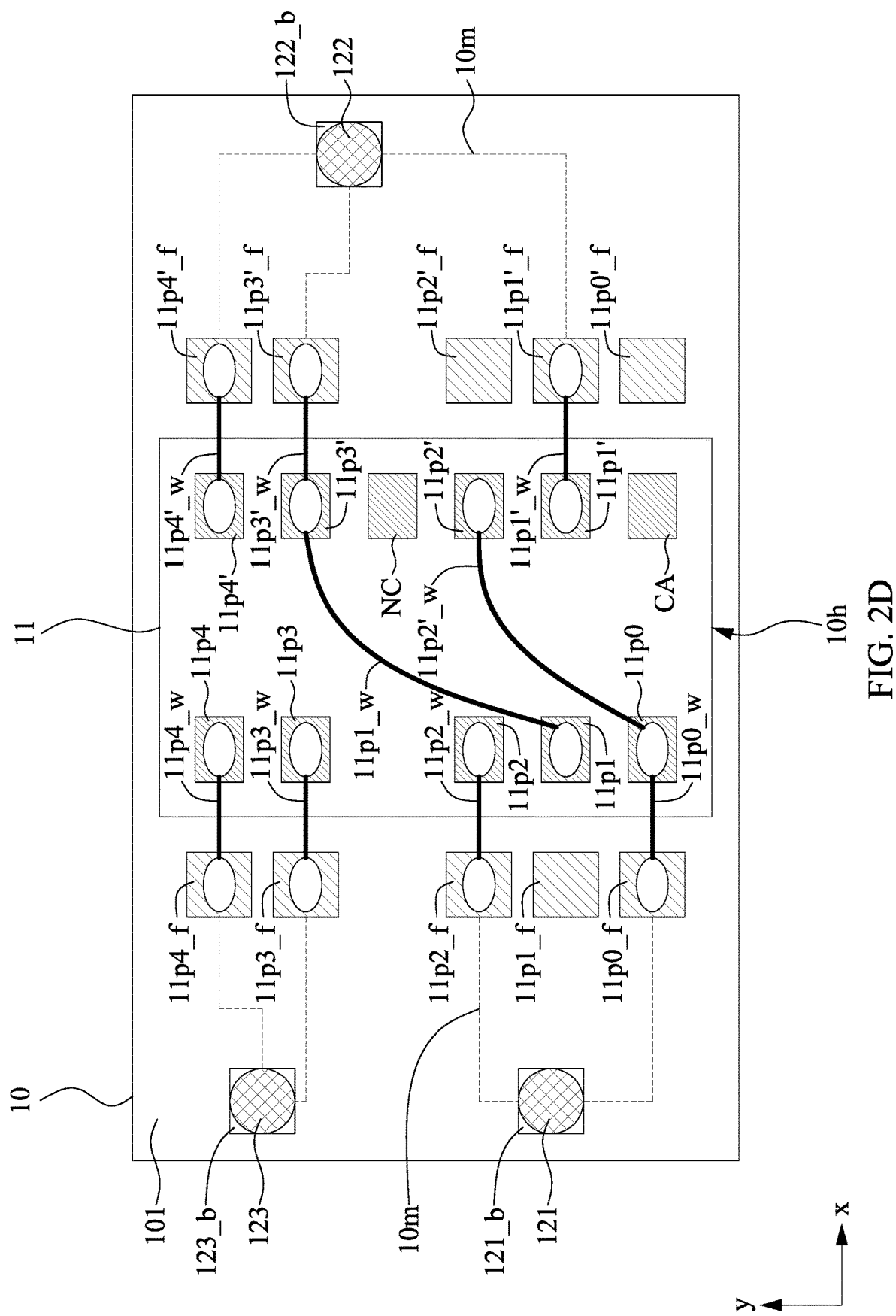
FIG. 2D is a top view of a WBGA package in accordance with some embodiments of the present disclosure.

FIG. 2D is a top view of a WBGA package in accordance with some embodiments of the present disclosure. The WBGA package in FIG. 2D is similar to that of the WBGA package in FIG. 2A, except that the bonding pad 11p1 is electrically connected with the bonding finger 11p3'_f through the bonding wire 11p1_w, the bonding pad 11p3' and the bonding wire 11p3'_w.

In addition, the bonding pad 11p2' is electrically connected with the bonding finger 11p0_f through the bonding wire 11p2'_w, the bonding pad 11p0 and the bonding wire 11p0_w.

In some embodiments, the bonding pads (such as the bonding pads 11p2' and 11p0) connected through a bonding wire may not be aligned. For example, a bonding wire between the bonding pads may extend in an oblique direction with respect to the reference y-axis and/or the reference x-axis. For example, a bonding wire between the bonding pads may be angled with respect to the reference y-axis and/or the reference x-axis.

Figure 3:
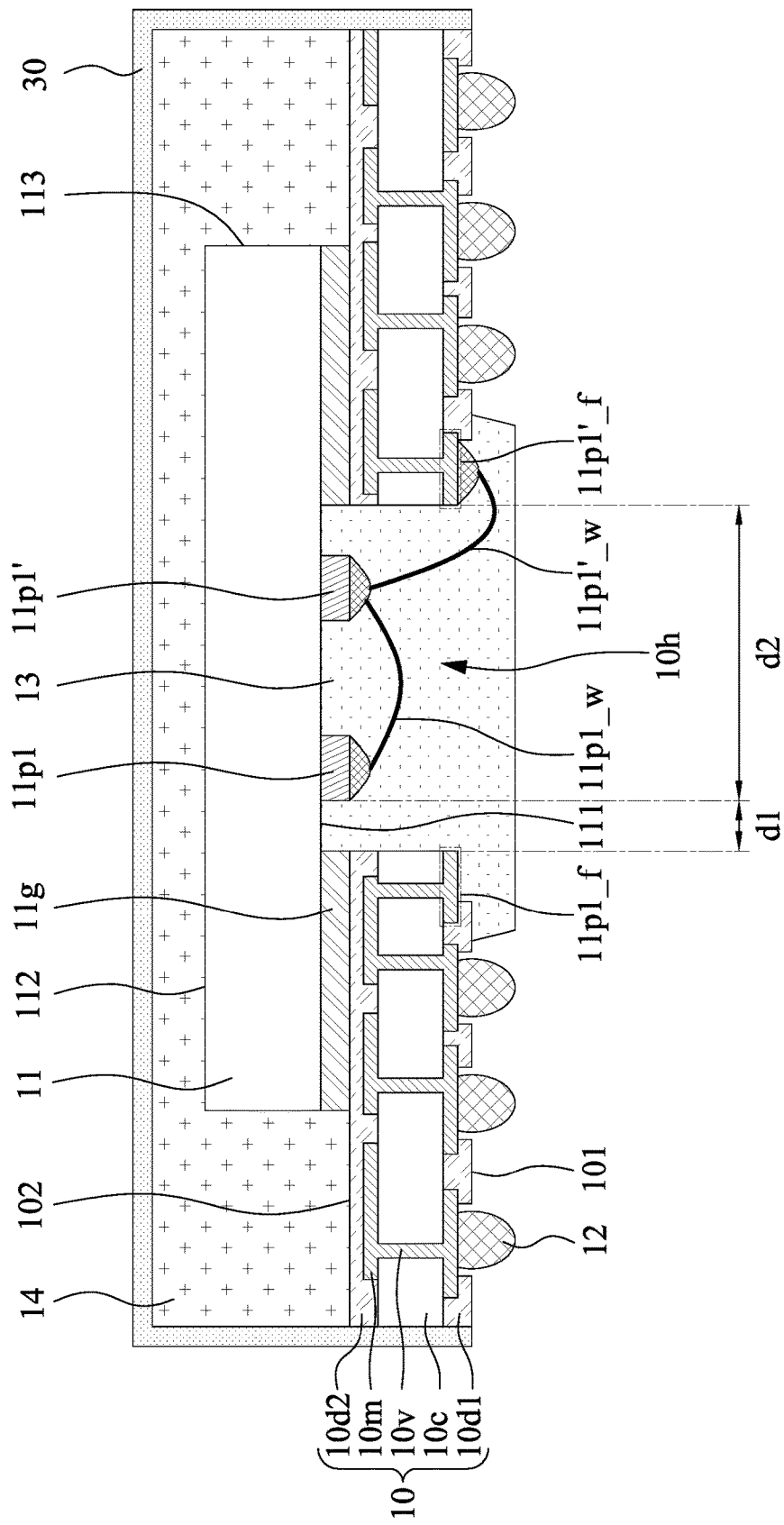
FIG. 3 is a schematic cross-sectional view of a WBGA package in accordance with some embodiments of the present disclosure.

FIG. 3 is a schematic cross-sectional view of a WBGA package 3 in accordance with some embodiments of the present disclosure. The WBGA package 3 in FIG. 3 is similar to that of the WBGA package 1 in FIG. 1A, except that the WBGA package 3 further includes a conductive layer 30 disposed on the exterior surfaces of the package body 14.

In some embodiments, the conductive layer 30 may be conformal to the exterior surfaces of the package body 14. In some embodiments, the conductive layer 30 may contact the carrier 10. In some embodiments, the conductive layer 30 may be connected to a ground and thus is grounded. In some embodiments, the conductive layer 30 may be connected to conductive lines (or conductive traces) 10m. In some embodiments, the conductive layer 30 may be configured to connect with a grounding node of the carrier 10.

Figure 4:
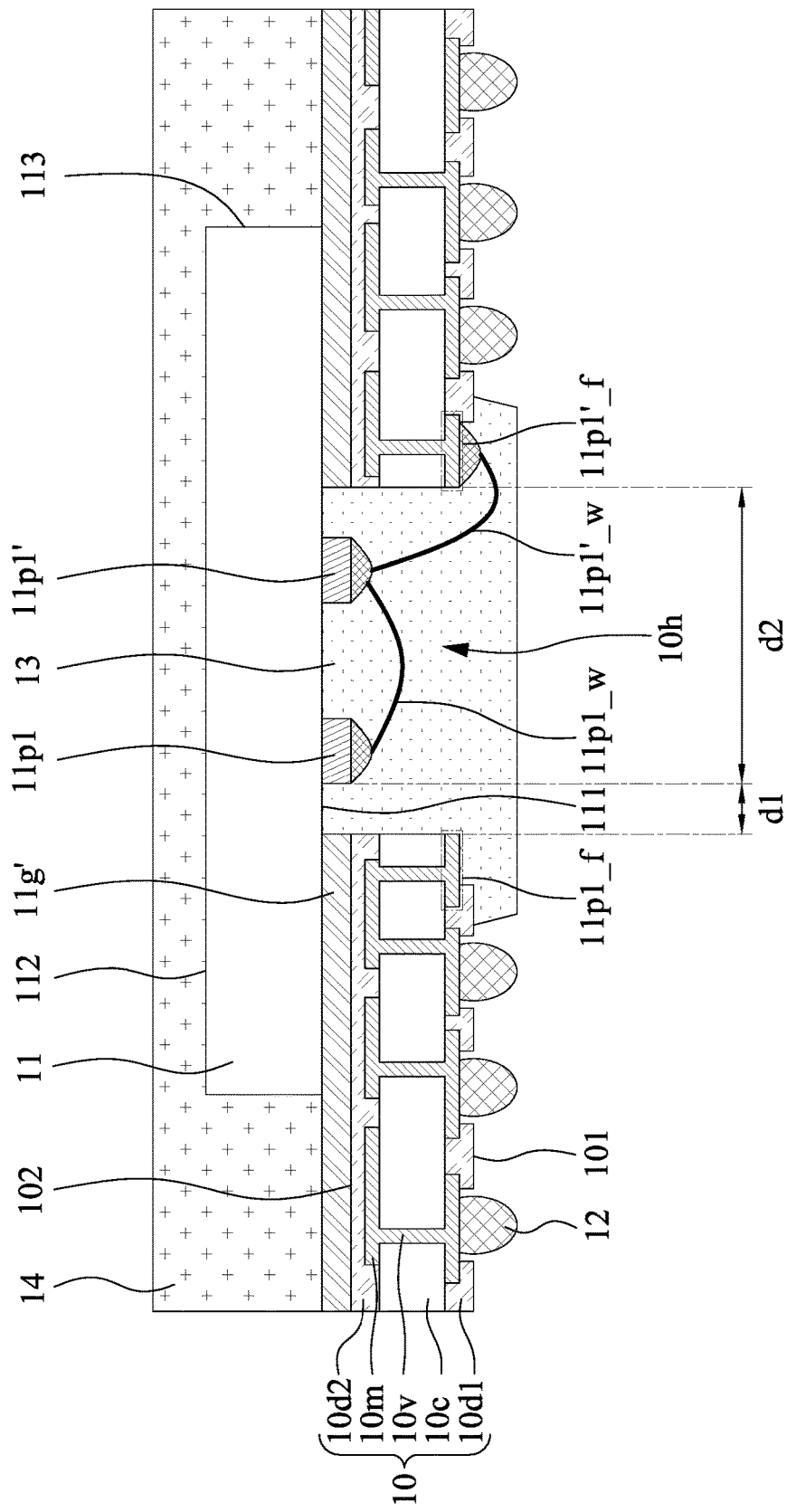
FIG. 4 is a schematic cross-sectional view of a WBGA package in accordance with some embodiments of the present disclosure.

FIG. 4 is a schematic cross-sectional view of a WBGA package 4 in accordance with some embodiments of the present disclosure. The WBGA package 4 in FIG. 4 is similar to that of the WBGA package 1 in FIG. 1A, except that the adhesive layer 11g' of the WBGA package 4 is not coplanar with the surface 113 of the electronic component 11.

In some embodiments, the adhesive layer 11g' may extend from an internal sidewall of the through hole 10h to a lateral surface of the carrier 10. In some embodiments, the surface 102 of the carrier 10 may be entirely covered by the adhesive layer 11g'.

Figure 5:
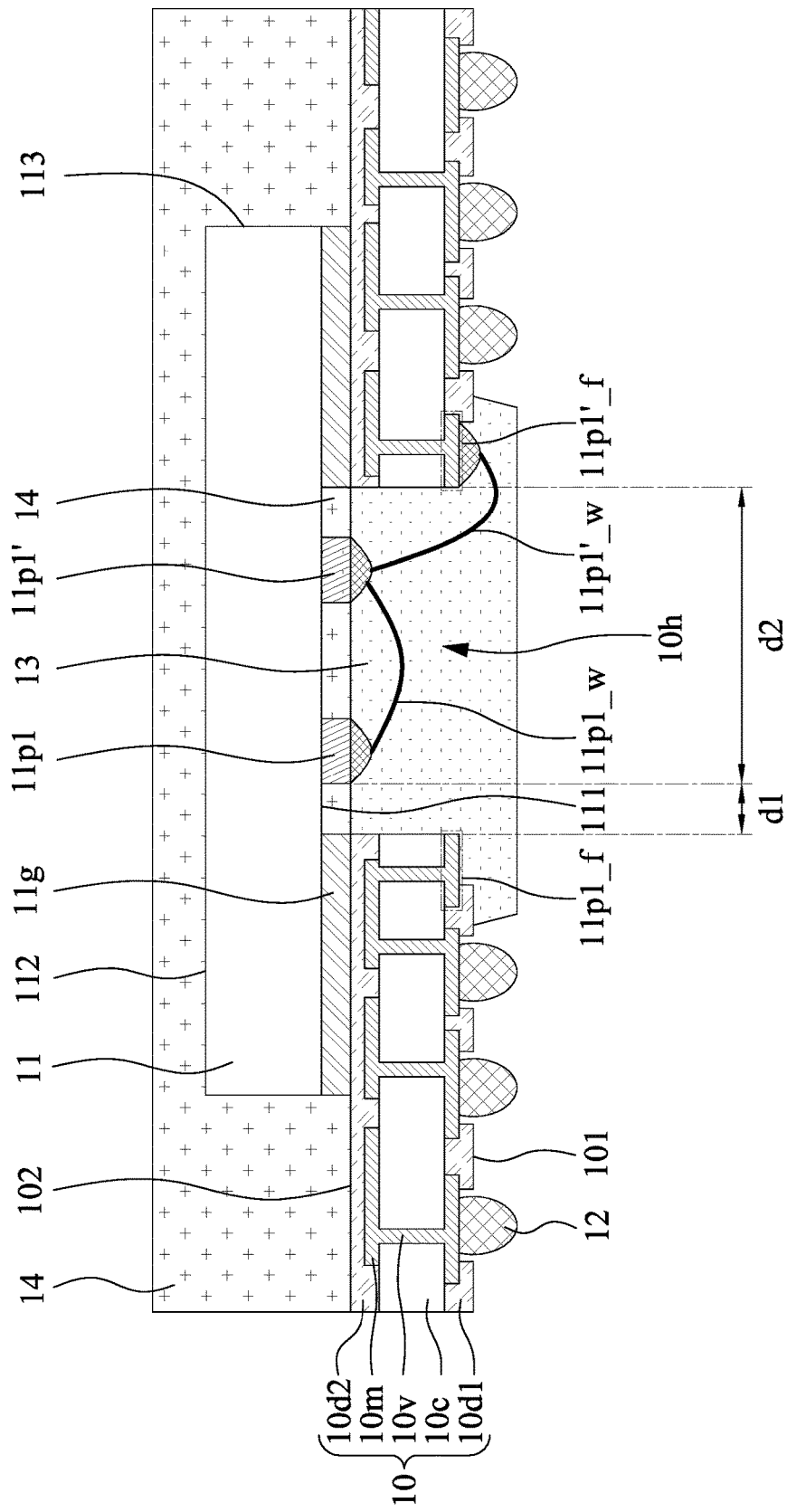
FIG. 5 is a schematic cross-sectional view of a WBGA package in accordance with some embodiments of the present disclosure.

FIG. 5 is a schematic cross-sectional view of a WBGA package 5 in accordance with some embodiments of the present disclosure. The WBGA package 5 in FIG. 5 is similar to that of the WBGA package 1 in FIG. 1A, except that the bonding pads 11p1 and 11p1' of the WBGA package 5 are surrounded by the package body 14.

For example, a part of the package body 14 may be disposed between the surface 111 of the electronic component 11 and the package body 13.

FIGS. 6A, 6B, 6C, 6D, 6E and 6F illustrate stages of a method of manufacturing a WBGA package in accordance with some embodiments of the present disclosure. At least some of these figures have been simplified for a better understanding of the aspects of the present disclosure. In some embodiments, the WBGA package 1 in FIG. 1A may be manufactured by the operations described below with respect to FIGS. 6A, 6B, 6C, 6D, 6E and 6F.

Figure 6A:
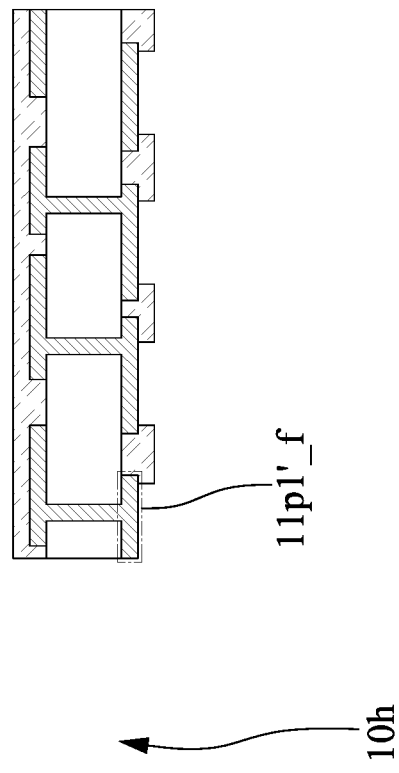
FIG. 6A illustrates one or more stages of a method of manufacturing a WBGA package in accordance with some embodiments of the present disclosure.
Figure 6A:
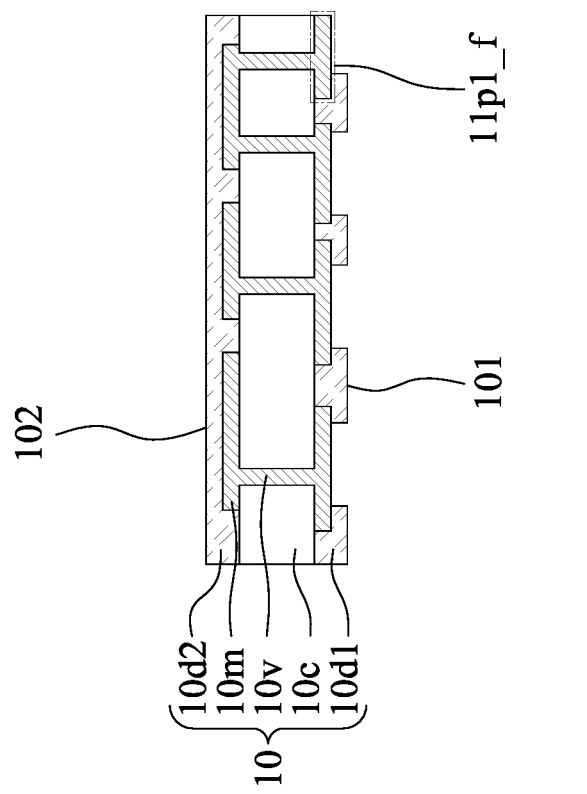

Referring to FIG. 6A, a carrier 10 is provided. The carrier 10 may have a surface 101 and a surface 102 opposite to the surface 101. In some embodiments, the carrier 10 may include or define a through hole 10h penetrating or traversing through the carrier 10. The through hole 10h may extend between the surface 101 and the surface 102. The carrier 10 may include bonding fingers 11p1_f and 11p1'_f.

Figure 6B:
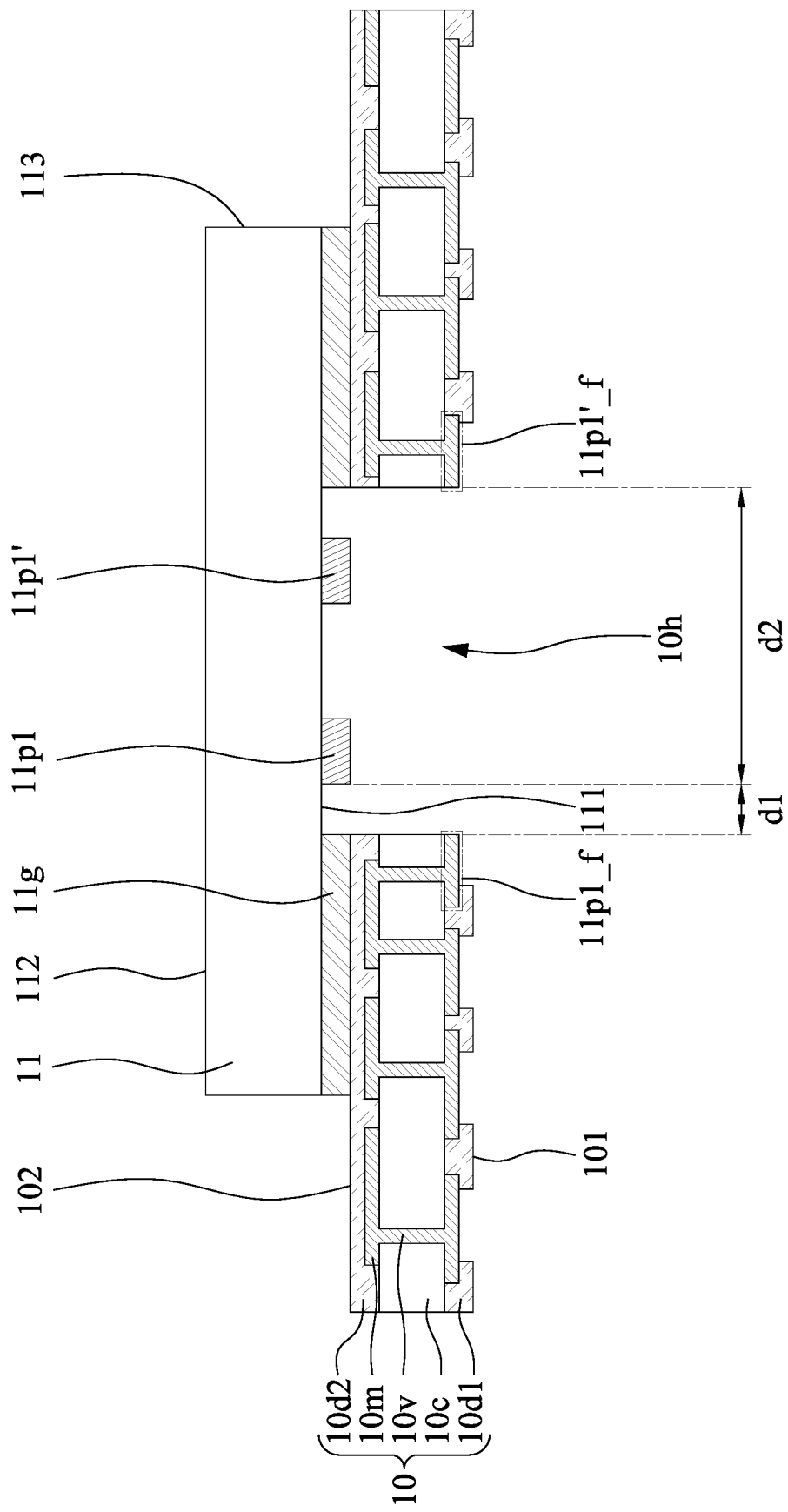
FIG. 6B illustrates one or more stages of a method of manufacturing a WBGA package in accordance with some embodiments of the present disclosure.

Referring to FIG. 6B, an electronic component 11 is disposed on the surface 102 of the carrier 10. Bonding pads 11p1 and 11p1' may be disposed on the electronic component 11.

Figure 6C:
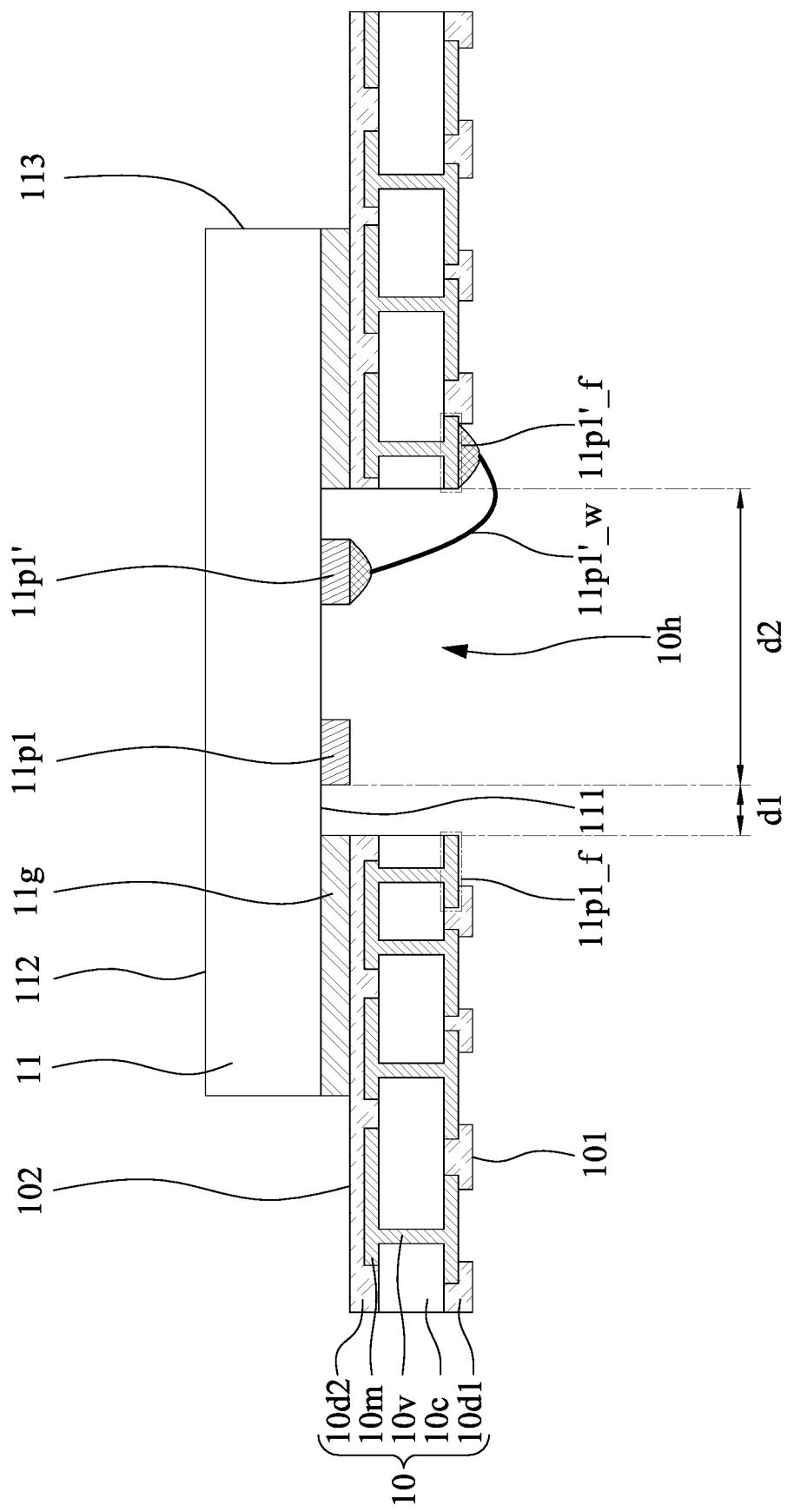
FIG. 6C illustrates one or more stages of a method of manufacturing a WBGA package in accordance with some embodiments of the present disclosure.

Referring to FIG. 6C, the bonding pad 11p1' and the bonding finger 11p1'_f are connected through a bonding wire 11p1'_w.

Figure 6D:
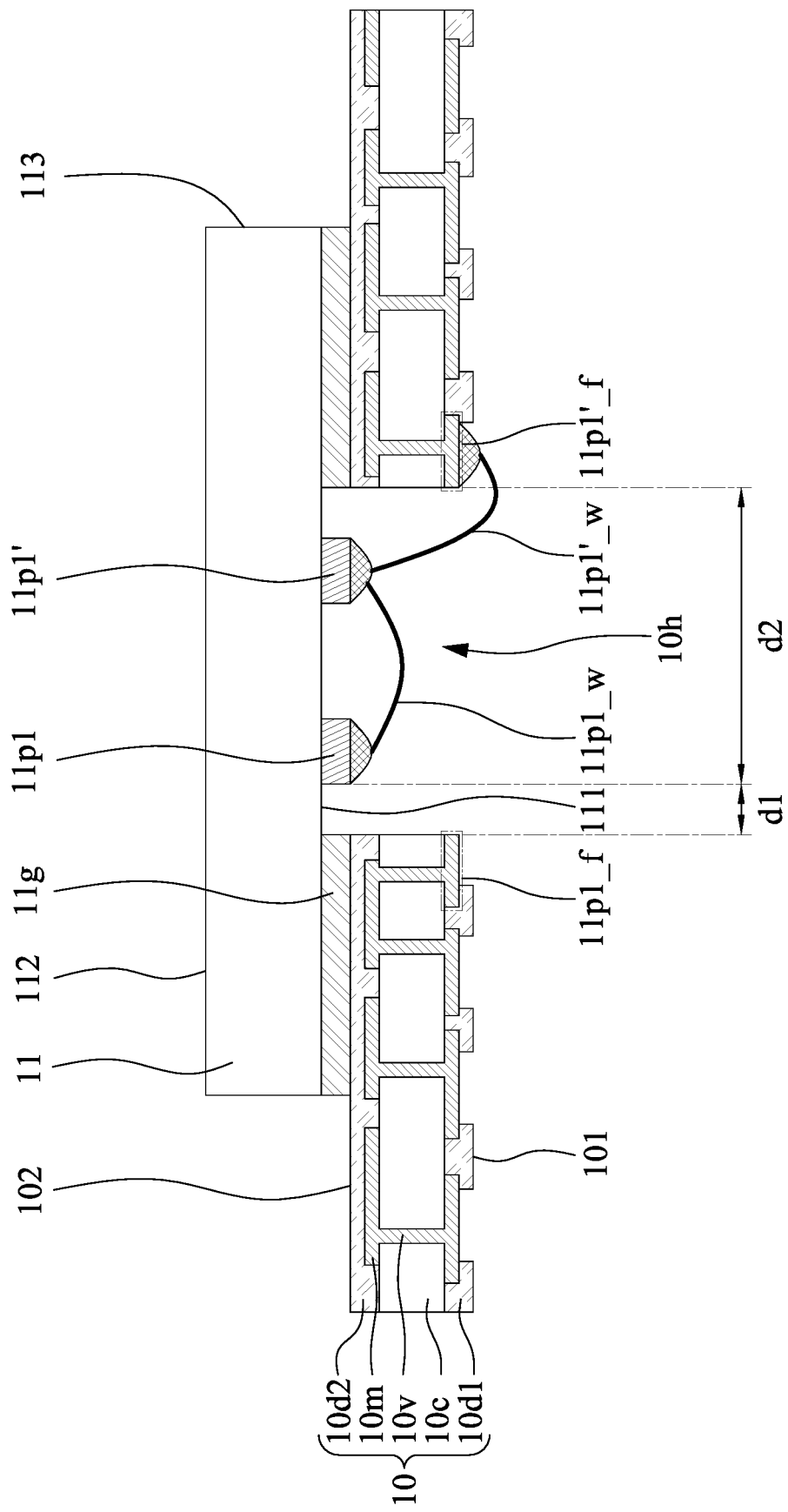
FIG. 6D illustrates one or more stages of a method of manufacturing a WBGA package in accordance with some embodiments of the present disclosure.

Referring to FIG. 6D, the bonding pad 11p1 and the bonding pad 11p1' are connected through a bonding wire 11p1_w. In some embodiments, the operation in FIG. 6D may be conducted before the operation in FIG. 6C. For example, the bonding wire 11p1_w may be formed before the bonding wire 11p1'_w is formed.

Figure 6E:
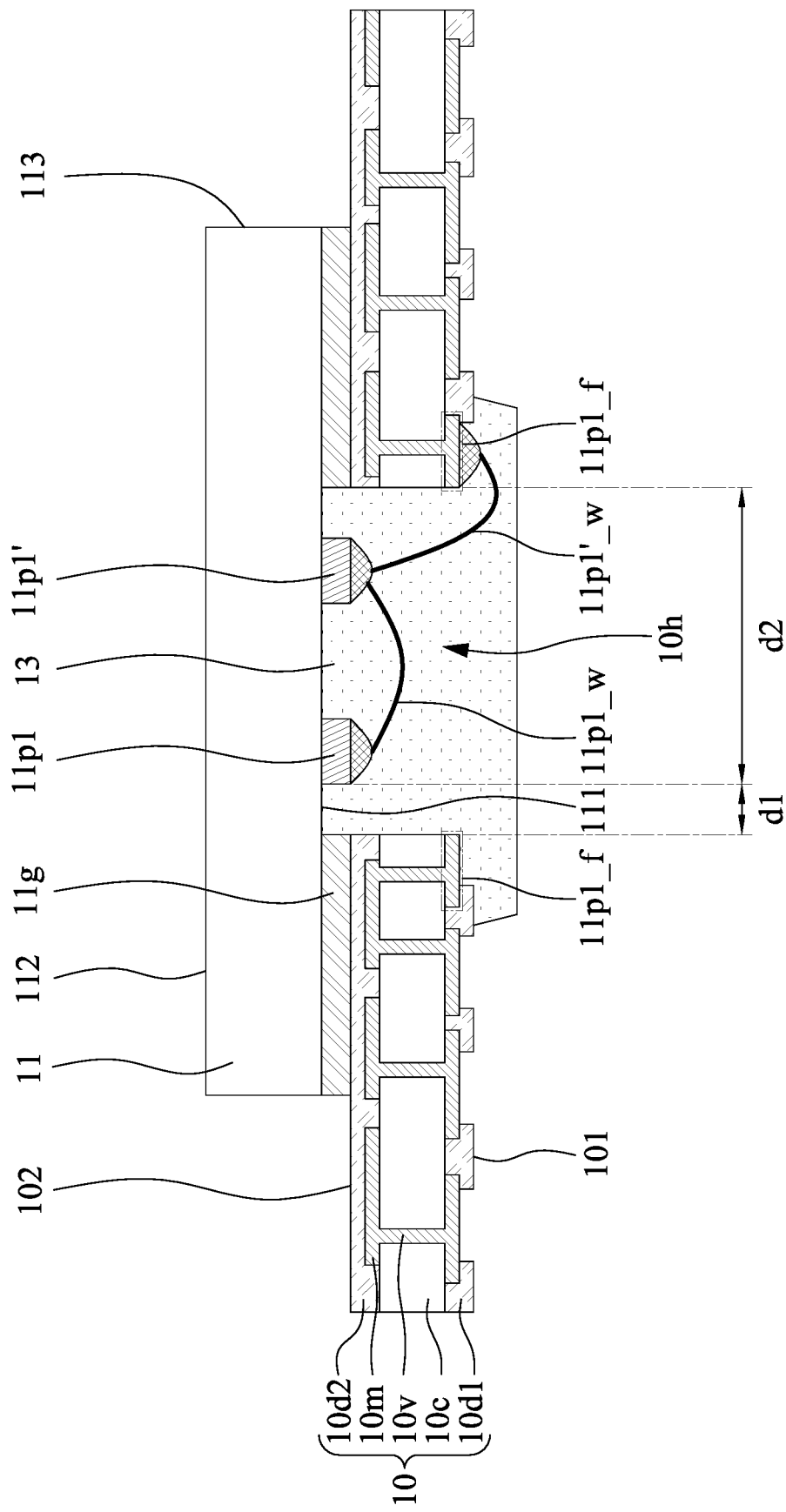
FIG. 6E illustrates one or more stages of a method of manufacturing a WBGA package in accordance with some embodiments of the present disclosure.

Referring to FIG. 6E, a package body 13 may be disposed in the through hole 10h to be disposed on, cover, contact or surround at least a part of the bonding wires 11p1_w and 11p1'_w. In some embodiments, the package body 13 may be formed by a molding technique, such as transfer molding or compression molding.

Figure 6F:
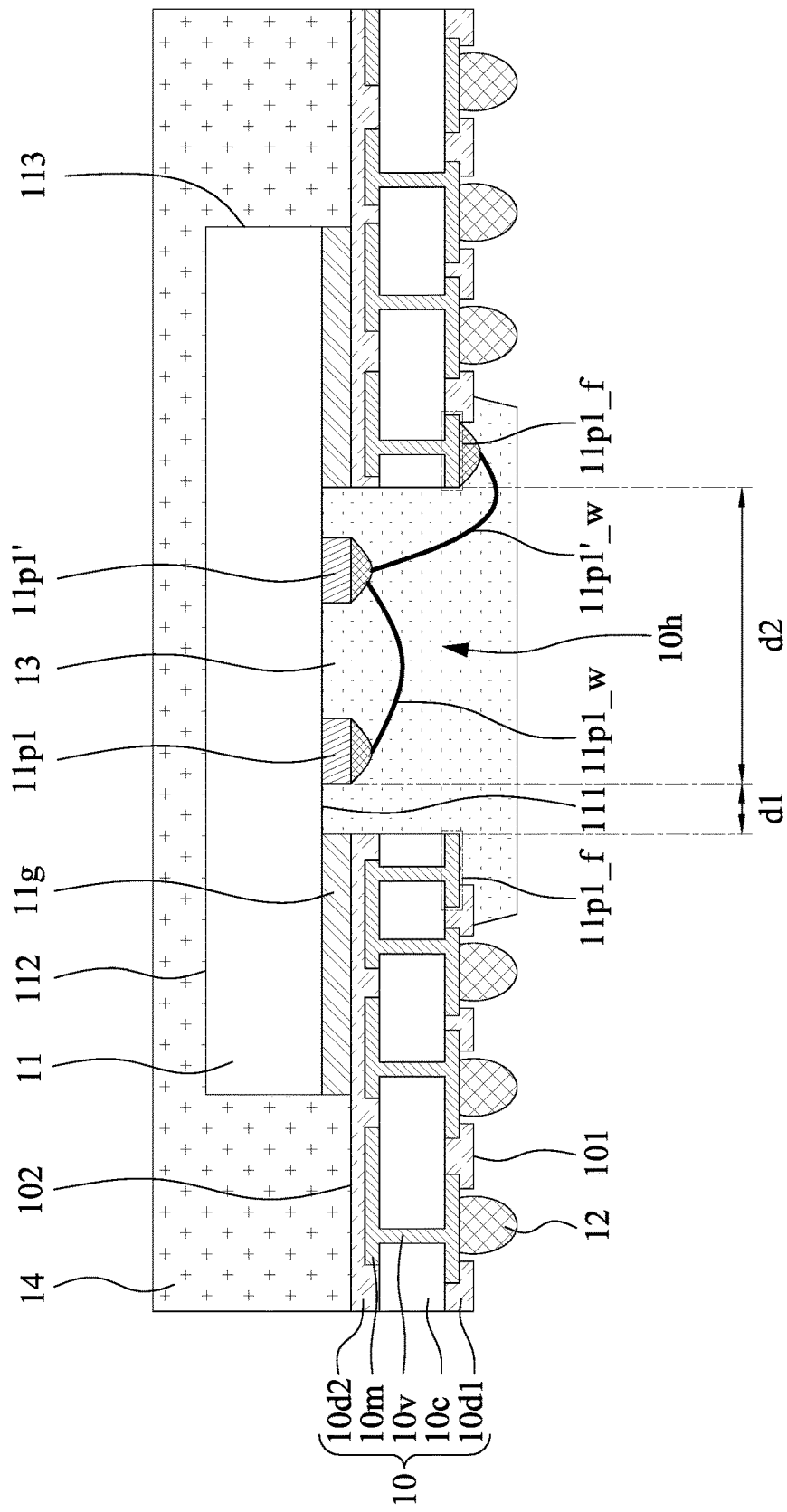
FIG. 6F illustrates one or more stages of a method of manufacturing a WBGA package in accordance with some embodiments of the present disclosure.

Referring to FIG. 6F, a package body 14 may be disposed on the surface 102 of the carrier 10 to encapsulate or cover the electronic component 11. In some embodiments, the package body 14 may be formed by a molding technique, such as transfer molding or compression molding. In some embodiments, the operation in FIG. 6F may be conducted before the operation in FIG. 6E. For example, the package body 14 may be formed before the package body 13 is formed.

One or more electrical contact 12 may be disposed on the I/O terminal pad (such as ball pad) of the carrier 10. The electrical contact 12 may be electrically connected to an underlying PCB (not shown) to provide electrical connections, for example, I/O connections, of the carrier 10. For example, the electrical contact 12 may include or be electrically connected to a GND node, a VDD node or a voltage node. In some embodiments, the operation of forming the electrical contact 12 may be conducted before the operation of forming the package body 13. In some embodiments, the operation of forming the electrical contact 12 may be conducted before the operation of forming the package body 14.

Figure 7A:
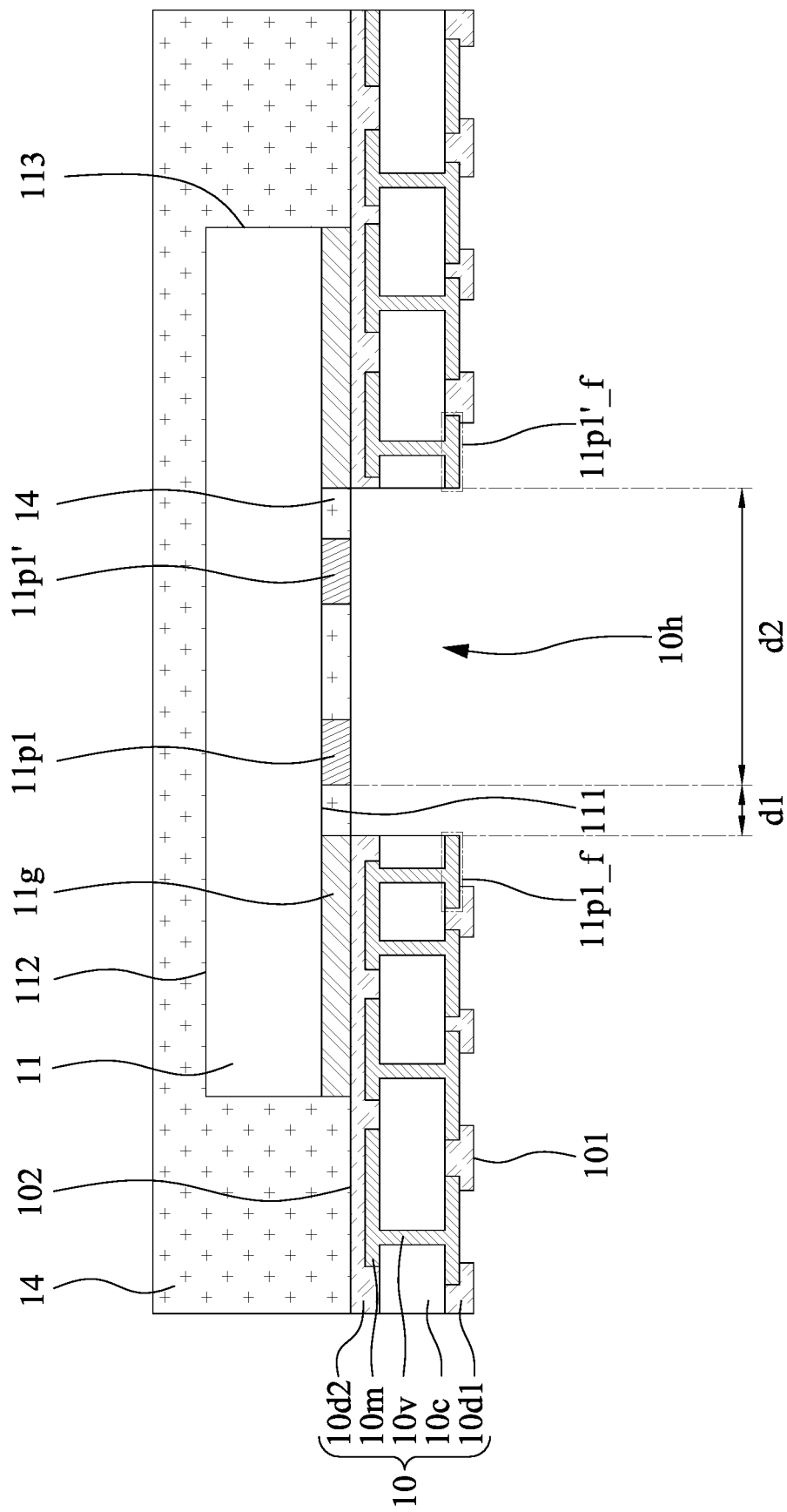
FIG. 7A illustrates one or more stages of a method of manufacturing a WBGA package in accordance with some embodiments of the present disclosure.
Figure 7B:
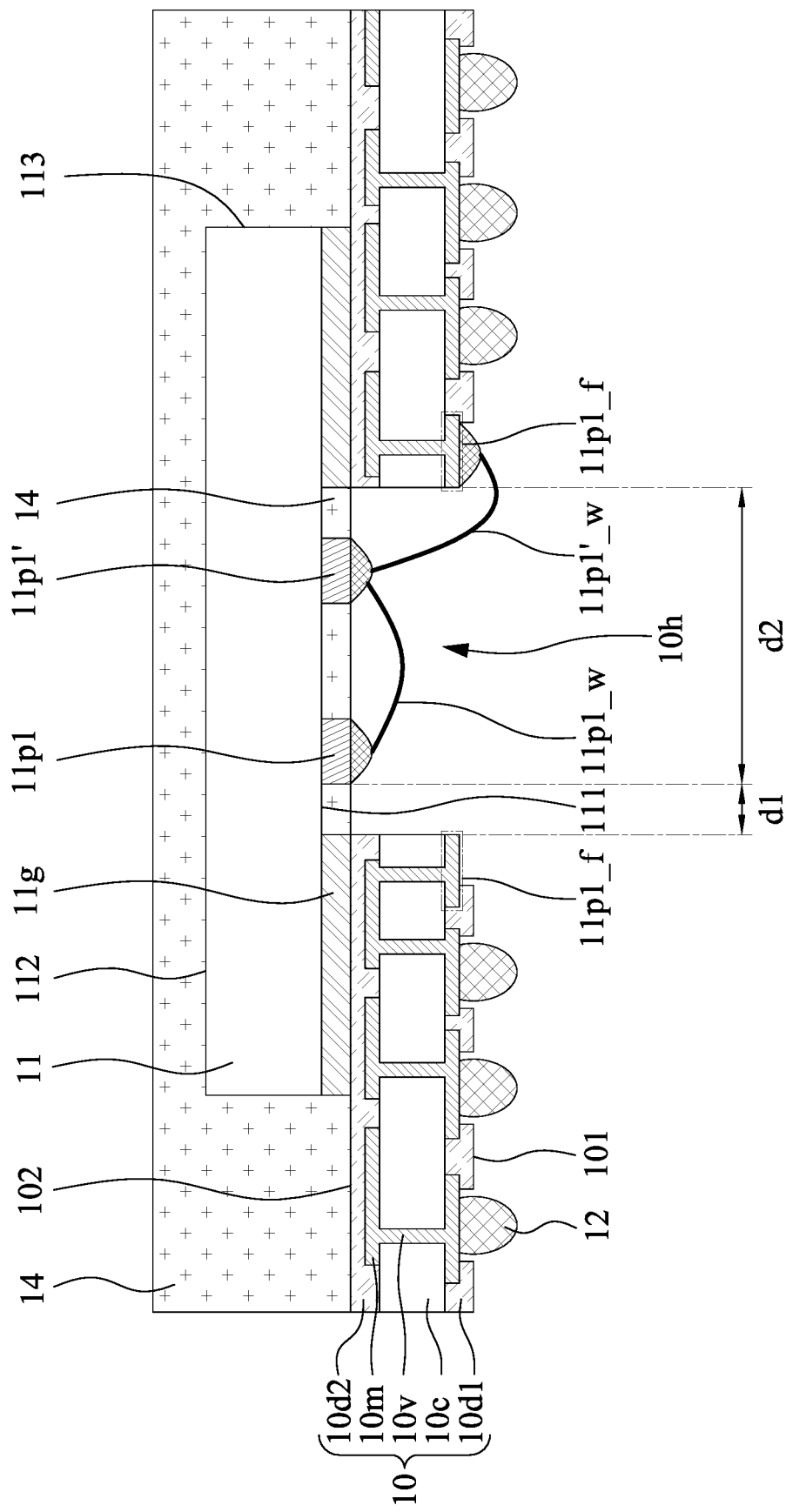
FIG. 7B illustrates one or more stages of a method of manufacturing a WBGA package in accordance with some embodiments of the present disclosure.
Figure 7C:
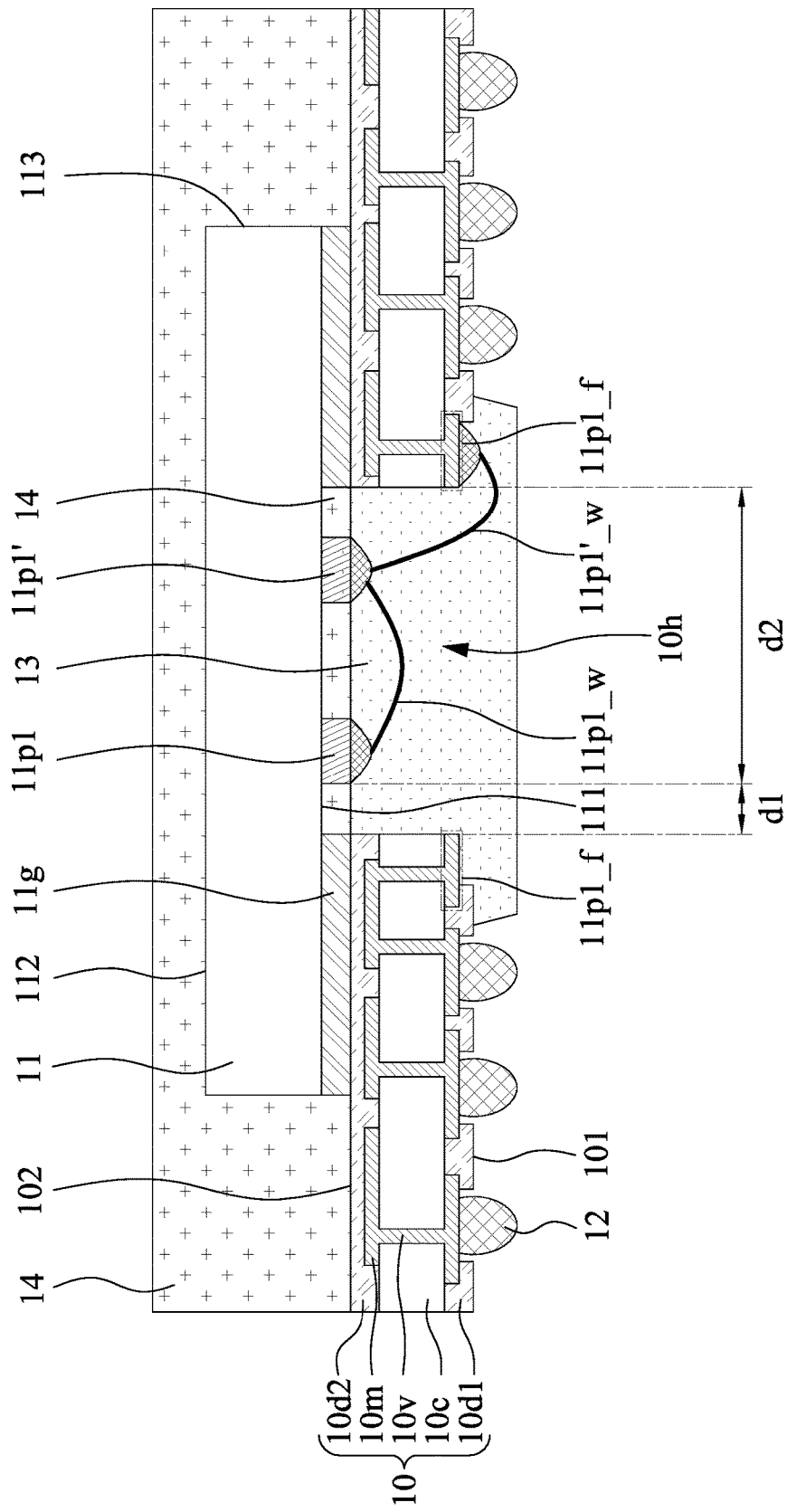
FIG. 7C illustrates one or more stages of a method of manufacturing a WBGA package in accordance with some embodiments of the present disclosure.

FIGS. 7A, 7B and 7C illustrate stages of a method of manufacturing a WBGA package in accordance with some embodiments of the present disclosure. At least some of these figures have been simplified for a better understanding of the aspects of the present disclosure. In some embodiments, the WBGA package 5 in FIG. 5 may be manufactured by the operations described below with respect to FIGS. 7A, 7B and 7C.

The operation in FIG. 7A may be subsequent to the operation in FIG. 6B. The electronic component 11 is disposed on the surface 102 of the carrier 10. Then, the package body 14 may be disposed on the surface 102 of the carrier 10 to encapsulate or cover the electronic component 11. The bonding pads 11p1 and 11p1' of the WBGA package 5 are surrounded by the package body 14.

In some embodiments, the package body 14 may be disposed on the electronic component 11, and then the electronic component 11 is disposed on the carrier 10.

Referring to FIG. 7B, the bonding pad 11p1' and the bonding finger 11p1'_f are connected through the bonding wire 11p1'_w. The bonding pad 11p1 and the bonding pad 11p1' are connected through the bonding wire 11p1_w. The bonding wire 11p1_w may be formed before the bonding wire 11p1'_w is formed. Alternatively, the bonding wire 11p1'_w may be formed before the bonding wire 11p1_w is formed.

Referring to FIG. 7C, the package body 13 may be disposed in the through hole 10h to be disposed on, cover, contact or surround at least a part of the bonding wires 11p1_w and 11p1'_w. A part of the package body 14 may be disposed between the surface 111 of the electronic component 11 and the package body 13.

Figure 8:
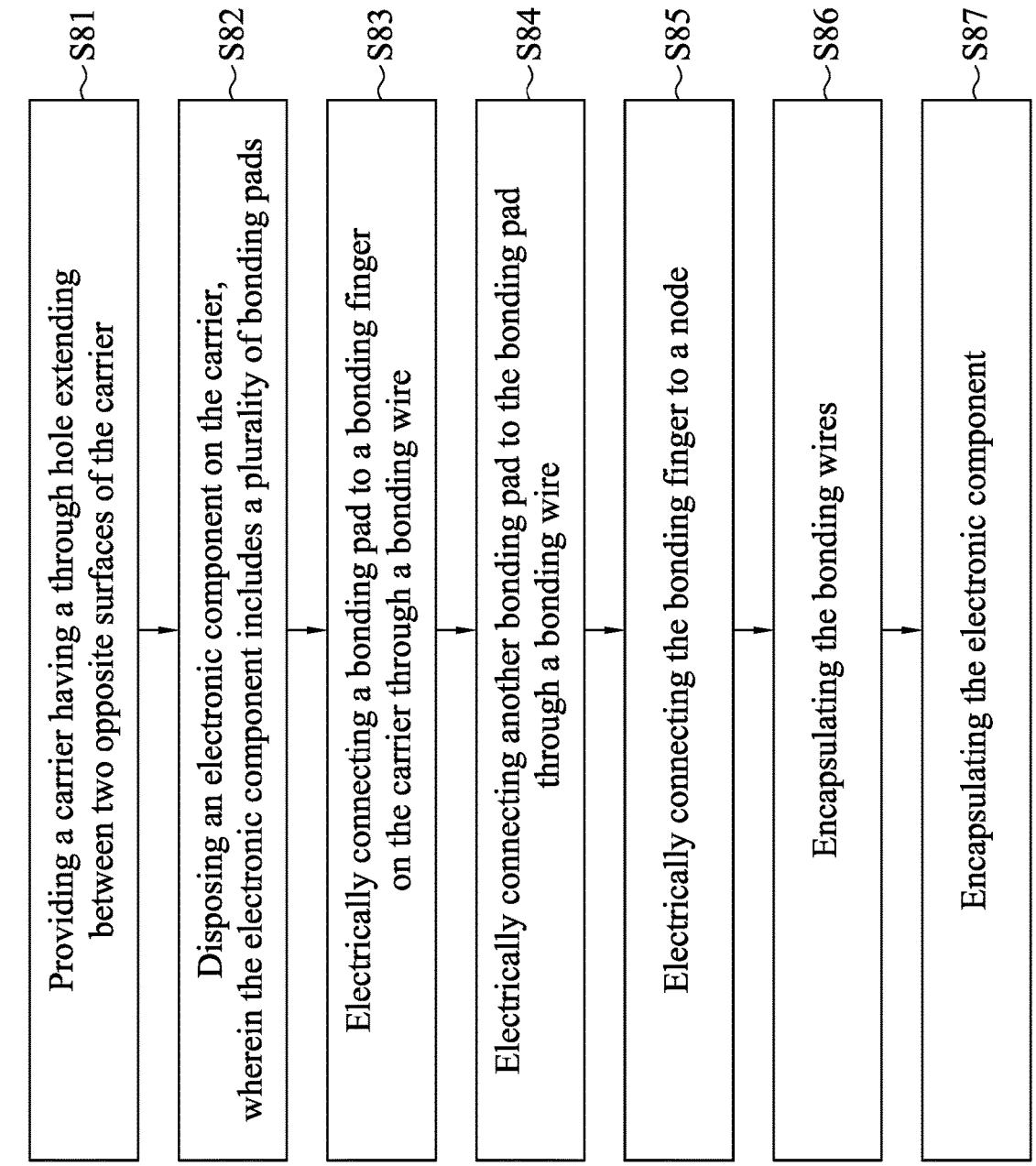
FIG. 8 illustrates a flow chart of a method of manufacturing a WBGA package in accordance with some embodiments of the present disclosure.

FIG. 8 illustrates a flow chart of a method 80 of manufacturing a WBGA package in accordance with some embodiments of the present disclosure.

The step or operation S81 is providing a carrier having a through hole extending between two opposite surfaces of the carrier.

For example, as shown in FIG. 6A, a carrier 10 is provided. The carrier 10 may have a surface 101 and a surface 102 opposite to the surface 101. In some embodiments, the carrier 10 may include or define a through hole 10h penetrating or traversing through the carrier 10. The through hole 10h may extend between the surface 101 and the surface 102. The carrier 10 may include bonding fingers 11p1_f and 11p1'_f.

The step or operation S82 is disposing an electronic component on the carrier, wherein the electronic component includes a plurality of bonding pads.

For example, as shown in FIG. 6B, an electronic component 11 is disposed on the surface 102 of the carrier 10. Bonding pads 11p1 and 11p1' may be disposed on the electronic component 11.

The step or operation S83 is electrically connecting a bonding pad to a bonding finger on the carrier through a bonding wire.

For example, as shown in FIG. 6C, the bonding pad 11p1' and the bonding finger 11p1'_f are connected through a bonding wire 11p1'_w.

The step or operation S84 is electrically connecting another bonding pad to the bonding pad through a bonding wire.

For example, as shown in FIG. 6D, the bonding pad 11p1 and the bonding pad 11p1' are connected through a bonding wire 11p1_w.

The step or operation S85 is electrically connecting the bonding finger to a node.

For example, as shown in FIG. 6F, one or more electrical contact 12 may be disposed on the I/O terminal pad (such as a ball pad) of the carrier 10. The electrical contact 12 may include or be electrically connected to a GND node, a VDD node or a voltage node.

The step or operation S86 is encapsulating the bonding wires.

For example, as shown in FIG. 6E, a package body 13 may be disposed in the through hole 10h to be disposed on, cover, contact or surround at least a part of the bonding wires 11p1'_w and 11p1'_w.

The step or operation S87 is encapsulating the electronic component.

For example, as shown in FIG. 6F, a package body 14 may be disposed on the surface 102 of the carrier 10 to encapsulate or cover the electronic component 11.

One aspect of the present disclosure provides a WBGA package. The WBGA package includes a carrier having a first surface and a second surface opposite to the first surface of the carrier. The carrier has a through hole extending between the first surface and the second surface of the carrier. The WBGA package also includes an electronic component disposed on the second surface of the carrier. The electronic component includes a first bonding pad and a second bonding pad. The WBGA package also includes a first bonding wire electrically connected between the first bonding pad and the second bonding pad.

Another aspect of the present disclosure provides a WBGA package. The WBGA package includes a carrier having a first surface and a second surface opposite to the first surface of the carrier. The carrier has a through hole extending between the first surface and the second surface of the carrier. The WBGA package also includes an electronic component disposed on the second surface of the carrier. The electronic component includes a first bonding pad and a second bonding pad electrically connected with a node.

Another aspect of the present disclosure provides a method of manufacturing a WBGA package. The method includes providing a carrier having a first surface and a second surface opposite to the first surface of the carrier. The carrier has a through hole extending between the first surface and the second surface of the carrier. The method also includes disposing an electronic component on the second surface of the carrier. The electronic component includes a first bonding pad and a second bonding pad. The method also includes electrically connecting the first bonding pad and the second bonding pad through a first bonding wire.

According to some embodiments of the present disclosure, a bonding pad on an electronic component is utilized to electrically connect an adjacent bonding pad to a bonding finger on a carrier. In other words, the bonding pad can be viewed as a relay point or a springboard for connecting the adjacent bonding pad to the bonding finger. The bonding pads can be electrically connected through a bonding wire.

By electrically connecting the bonding pads through a bonding wire, the routing of the circuitry of the carrier can be more flexible, the interconnections per unit area can be increased, and the pitch or spacing between adjacent pads can be further reduced to miniaturize the package size.

Although the present disclosure and its advantages have been described in detail, it should be understood that various changes, substitutions and alterations can be made herein without departing from the spirit and scope of the disclosure as defined by the appended claims. For example, many of the processes discussed above can be implemented in different methodologies and replaced by other processes, or a combination thereof.

Moreover, the scope of the present application is not intended to be limited to the particular embodiments of the process, machine, manufacture, and composition of matter, means, methods and steps described in the specification. As one of ordinary skill in the art will readily appreciate from the present disclosure, processes, machines, manufacture, compositions of matter, means, methods, or steps, presently existing or later to be developed, that perform substantially the same function or achieve substantially the same result as the corresponding embodiments described herein may be utilized according to the present disclosure. Accordingly, the appended claims are intended to include within their scope such processes, machines, manufacture, compositions of matter, means, methods, or steps.

What is claimed is:

1. A window ball grid array (WBGA) package, comprising:
a carrier having a first surface and a second surface opposite to the first surface of the carrier, wherein the carrier has a through hole filled with a first package body and extending between the first surface and the second surface of the carrier;
an electronic component disposed on the second surface of the carrier, wherein the electronic component includes a first bonding pad and a second bonding pad; and
a first bonding wire electrically connected between the first bonding pad and the second bonding pad;
wherein the first bonding pad and the second bonding pad are extended within the through hole of the carrier, such that at least a portion of the first bonding wire is disposed within the through hole to electrically connect the first bonding pad and the second bonding pad.

2. The WBGA package of claim 1, wherein the first bonding pad and the second bonding pad are symmetrically arranged on an active surface of the electronic component, wherein first surfaces of the first bonding pad and the second bonding pad are disposed on the active surface of the electronic component while second surfaces of the first bonding pad and the second bonding pad are coplanar with the second surface of the carrier.

3. The WBGA package of claim 1, wherein the carrier comprises a first bonding finger on the first surface of the carrier and a second bonding finger on the first surface of the carrier, and wherein the first bonding pad is closer to the first bonding finger than to the second bonding finger.

4. The WBGA package of claim 3, wherein the second bonding finger is electrically connected to a node and the first bonding finger is disconnected from the node, and the node comprises a power node or a grounding node.

5. The WBGA package of claim 3, wherein the first bonding finger and the second bonding finger are separated by the through hole.

6. The WBGA package of claim 3, further comprising:
a third bonding finger adjacent to the first bonding finger; and
a fourth bonding finger adjacent to the first bonding finger and electrically connected with the third bonding finger;
wherein the first bonding finger is at least partially surrounded by a conductive line connected between the third bonding finger and the fourth bonding finger.

7. The WBGA package of claim 3, further comprising:
a second bonding wire electrically connected between the second bonding pad and the second bonding finger.

8. The WBGA package of claim 7, wherein the second bonding wire extends through the through hole, and the first bonding wire and the second bonding wire extend from the second bonding pad in opposite direction.

9. The WBGA package of claim 7, wherein the first bonding wire and the second bonding wire are encapsulated by the first package body.

10. The WBGA package of claim 9, wherein the first bonding pad and the second bonding pad are partially surrounded by the first package body.

11. The WBGA package of claim 9, wherein the first bonding pad and the second bonding pad are partially surrounded by a second package body.

12. A window ball grid array (WBGA) package, comprising:
- a carrier having a first surface and a second surface opposite to the first surface of the carrier, wherein the carrier has a through hole filled with a first package body and extending between the first surface and the second surface of the carrier;
- an electrical contact disposed on the first surface of the carrier far away from the through hole; and
- an electronic component disposed on the second surface of the carrier;
- wherein the electronic component includes a first bonding pad and a second bonding pad electrically connected with a node;
- wherein the first bonding pad and the second bonding pad are extended within the through hole of the carrier;
- wherein the electrical contact is electrically connected to the node.

13. The WBGA package of claim 12, wherein the first bonding pad and the second bonding pad are symmetrically arranged on an active surface of the electronic component, and the node comprises a power node or a grounding node electrically connected to the electrical contact.

14. The WBGA package of claim 12, wherein the first bonding pad and the second bonding pad are electrically connected with a bonding finger on the first surface of the carrier, and the bonding finger is electrically connected to the node by a conductive line of the carrier.

15. The WBGA package of claim 12, wherein the second bonding pad is electrically connected with a first bonding wire and a second bonding wire, wherein the second bonding pad comprises a first stud and a second stud spaced apart from each other, wherein the first bonding wire and the second bonding wire are electrically connected to the first stud and the second stud respectively.

16. The WBGA package of claim 15, wherein the first bonding wire locates between the first surface and the second surface of the carrier.

17. The WBGA package of claim 16, wherein the second bonding wire extends through the through hole, and the first bonding wire and the second bonding wire extend from the second bonding pad in opposite directions.

18. The WBGA package of claim 16, wherein the first bonding wire and the second bonding wire are encapsulated by the first package body.

19. The WBGA package of claim 18, wherein the first bonding pad and the second bonding pad are partially surrounded by the first package body.

20. The WBGA package of claim 18, wherein the first bonding pad and the second bonding pad are partially surrounded by a second package body.

* * * * *